United States Patent
Wang et al.

(10) Patent No.: US 11,619,976 B2
(45) Date of Patent: Apr. 4, 2023

(54) COMPUTER WITH KEYBOARD

(71) Applicant: Apple Inc., Cupertino, CA (US)

(72) Inventors: Paul X. Wang, Cupertino, CA (US); Alex J. Lehmann, Sunnyvale, CA (US); Zheng Gao, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/876,350

(22) Filed: Jul. 28, 2022

(65) Prior Publication Data

US 2022/0365566 A1 Nov. 17, 2022

Related U.S. Application Data

(63) Continuation of application No. 16/996,617, filed on Aug. 18, 2020, now Pat. No. 11,409,332, which is a (Continued)

(51) Int. Cl.
*G06F 1/16* (2006.01)
*H05K 5/00* (2006.01)
(Continued)

(52) U.S. Cl.
CPC .......... *G06F 1/1662* (2013.01); *G06F 1/1616* (2013.01); *G06F 1/1637* (2013.01); (Continued)

(58) Field of Classification Search
CPC .... G06F 1/1679; G06F 1/1607; G06F 1/1616; G06F 1/1618; G06F 1/1624; G06F 1/1637; G06F 1/166; G06F 1/1632; G06F 1/1633; G06F 3/0202; G06F 3/0213; G06F 3/0236; G06F 3/041; G06F 3/044; G06F 3/04886; H03K 17/96; H03K 17/9618; H03K 17/967; H03K 17/972
See application file for complete search history.

(56) References Cited

U.S. PATENT DOCUMENTS

| | | | |
|---|---|---|---|
| 4,596,905 A | 6/1986 | Fowler | |
| 4,598,181 A | 7/1986 | Selby | |

(Continued)

FOREIGN PATENT DOCUMENTS

| | | |
|---|---|---|
| CN | 1812030 | 8/2006 |
| CN | 1838036 | 9/2006 |

(Continued)

OTHER PUBLICATIONS

Elekson, "Reliable and Tested Wearable Electronics Embedment Solutions," http://www.wearable.technology/our-technologies, 3 pages, at least as early as Jan. 6, 2016.

*Primary Examiner* — Anthony M Haughton
(74) *Attorney, Agent, or Firm* — Brownstein Hyatt Farber Schreck, LLP

(57) ABSTRACT

A device may include a display portion that includes a display housing and a display at least partially within the display housing. The device may also include a base portion pivotally coupled to the display portion and including a bottom case, a top case coupled to the bottom case and defining an array of raised key regions, and a sensing system below the top case and configured to detect an input applied to a raised key region of the array of raised key regions.

20 Claims, 28 Drawing Sheets

Related U.S. Application Data continuation of application No. 16/045,651, filed on Jul. 25, 2018, now Pat. No. 10,775,850, which is a continuation of application No. 15/990,508, filed on May 25, 2018, now abandoned.

(60) Provisional application No. 62/537,350, filed on Jul. 26, 2017.

(51) Int. Cl.

| | | |
|---|---|---|
| *H05K 7/00* | (2006.01) | |
| *H03K 17/96* | (2006.01) | |
| *G06F 3/0354* | (2013.01) | |
| *G06F 3/041* | (2006.01) | |
| *H01H 13/83* | (2006.01) | |
| *G06F 3/04886* | (2022.01) | |
| *H03K 17/967* | (2006.01) | |
| *H03K 17/972* | (2006.01) | |
| *G06F 3/02* | (2006.01) | |
| *G06F 3/023* | (2006.01) | |
| *G06F 3/044* | (2006.01) | |

(52) U.S. Cl.
CPC .......... *G06F 1/1656* (2013.01); *G06F 3/0202* (2013.01); *G06F 3/0213* (2013.01); *G06F 3/0236* (2013.01); *G06F 3/03547* (2013.01); *G06F 3/041* (2013.01); *G06F 3/044* (2013.01); *G06F 3/04886* (2013.01); *H01H 13/83* (2013.01); *H03K 17/96* (2013.01); *H03K 17/967* (2013.01); *H03K 17/9618* (2013.01); *H03K 17/972* (2013.01); *G06F 2203/04105* (2013.01); *G06F 2203/04809* (2013.01); *H01H 2209/068* (2013.01); *H01H 2209/084* (2013.01); *H01H 2215/004* (2013.01); *H01H 2215/028* (2013.01); *H01H 2217/018* (2013.01); *H01H 2219/03* (2013.01); *H01H 2219/036* (2013.01); *H01H 2223/003* (2013.01); *H01H 2223/038* (2013.01)

(56) References Cited

U.S. PATENT DOCUMENTS

| | | |
|---|---|---|
| 4,987,275 A | 1/1991 | Miller et al. |
| 5,397,867 A | 3/1995 | Demeo |
| 5,477,430 A | 12/1995 | LaRose et al. |
| 5,804,780 A | 9/1998 | Bartha |
| 5,875,013 A | 2/1999 | Takahara |
| 5,876,106 A | 3/1999 | Kordecki et al. |
| 5,924,555 A | 7/1999 | Sadamori et al. |
| 5,935,691 A | 8/1999 | Tsai |
| 5,960,942 A | 10/1999 | Thornton |
| 6,259,046 B1 | 7/2001 | Iwama et al. |
| 6,482,032 B1 | 11/2002 | Szu et al. |
| 6,530,283 B2 | 3/2003 | Okada et al. |
| 6,538,801 B2 | 3/2003 | Jacobson et al. |
| 6,560,612 B1 | 5/2003 | Yamada et al. |
| 6,563,435 B1 * | 5/2003 | Platz .................... H01H 13/702 338/114 |
| 6,585,435 B2 | 7/2003 | Fang |
| 6,738,050 B2 | 5/2004 | Comiskey |
| 6,750,414 B2 | 6/2004 | Sullivan |
| 6,788,450 B2 | 9/2004 | Kawai et al. |
| 6,850,227 B2 | 2/2005 | Takahashi et al. |
| 6,911,608 B2 | 6/2005 | Levy |
| 6,926,418 B2 | 8/2005 | Ostergard et al. |
| 6,977,352 B2 | 12/2005 | Oosawa |
| 6,987,466 B1 | 1/2006 | Welch et al. |
| 6,987,503 B2 | 1/2006 | Inoue |
| 7,038,832 B2 | 5/2006 | Kanbe |
| 7,126,499 B2 | 10/2006 | Lin et al. |
| 7,161,084 B2 | 1/2007 | Sandbach |
| 7,166,813 B2 | 1/2007 | Soma |
| 7,172,303 B2 | 2/2007 | Shipman et al. |
| 7,256,766 B2 | 8/2007 | Albert et al. |
| 7,283,119 B2 | 10/2007 | Kishi |
| 7,378,607 B2 | 5/2008 | Koyano et al. |
| 7,385,806 B2 | 6/2008 | Liao |
| 7,391,555 B2 | 6/2008 | Albert et al. |
| 7,414,213 B2 | 8/2008 | Hwang |
| 7,432,460 B2 | 10/2008 | Clegg |
| 7,531,764 B1 | 5/2009 | Lev et al. |
| 7,589,292 B2 | 9/2009 | Jung et al. |
| 7,639,187 B2 | 12/2009 | Caballero et al. |
| 7,639,571 B2 | 12/2009 | Ishii et al. |
| 7,724,415 B2 | 5/2010 | Yamaguchi |
| 7,781,690 B2 | 8/2010 | Ishii |
| 7,782,307 B2 | 8/2010 | Westerman et al. |
| 7,813,774 B2 | 10/2010 | Perez-Noguera |
| 7,847,204 B2 | 12/2010 | Tsai |
| 7,851,819 B2 | 12/2010 | Shi |
| 7,866,866 B2 | 1/2011 | Wahlstrom |
| 7,999,748 B2 | 8/2011 | Ligtenberg et al. |
| 8,077,096 B2 | 12/2011 | Chiang et al. |
| 8,098,228 B2 | 1/2012 | Shimodaira et al. |
| 8,109,650 B2 | 2/2012 | Chang et al. |
| 8,124,903 B2 | 2/2012 | Tatehata et al. |
| 8,143,982 B1 | 3/2012 | Lauder et al. |
| 8,156,172 B2 | 4/2012 | Muehl et al. |
| 8,232,958 B2 | 7/2012 | Tolbert |
| 8,246,228 B2 | 8/2012 | Ko et al. |
| 8,263,887 B2 | 9/2012 | Chen et al. |
| 8,289,280 B2 | 10/2012 | Travis |
| 8,317,384 B2 | 11/2012 | Chung et al. |
| 8,319,298 B2 | 11/2012 | Hsu |
| 8,325,141 B2 | 12/2012 | Marsden |
| 8,330,725 B2 | 12/2012 | Mahowald et al. |
| 8,378,857 B2 | 2/2013 | Pance |
| 8,384,566 B2 | 2/2013 | Bocirnea |
| 8,451,146 B2 | 3/2013 | Mahowald et al. |
| 8,431,849 B2 | 4/2013 | Chen |
| 8,462,514 B2 | 6/2013 | Myers et al. |
| 8,500,348 B2 | 8/2013 | Dumont et al. |
| 8,548,528 B2 | 10/2013 | Kim et al. |
| 8,564,544 B2 | 10/2013 | Jobs et al. |
| 8,575,632 B2 | 11/2013 | Kuramoto et al. |
| 8,604,370 B2 | 12/2013 | Chao |
| 8,629,362 B1 | 1/2014 | Knighton et al. |
| 8,633,916 B2 | 1/2014 | Bernstein et al. |
| 8,651,720 B2 | 2/2014 | Sherman et al. |
| 8,692,784 B2 | 4/2014 | Cheng |
| 8,711,011 B2 | 4/2014 | Casparian et al. |
| 8,731,618 B2 | 5/2014 | Jarvis et al. |
| 8,748,767 B2 | 6/2014 | Ozias et al. |
| 8,760,405 B2 | 6/2014 | Nam |
| 8,786,548 B2 | 7/2014 | Oh et al. |
| 8,830,163 B2 | 9/2014 | Sim et al. |
| 8,847,090 B2 | 9/2014 | Ozaki |
| 8,847,711 B2 | 9/2014 | Yang et al. |
| 8,921,473 B1 | 12/2014 | Hyman |
| 8,922,476 B2 | 12/2014 | Stewart et al. |
| 8,926,111 B2 | 1/2015 | Weng |
| 8,927,890 B2 | 1/2015 | Peterson et al. |
| 8,943,427 B2 | 1/2015 | Heo et al. |
| 8,963,036 B2 | 2/2015 | Mittleman et al. |
| 8,976,117 B2 | 3/2015 | Krahenbuhl et al. |
| 8,994,641 B2 | 3/2015 | Stewart et al. |
| 9,007,297 B2 | 4/2015 | Stewart et al. |
| 9,041,652 B2 | 5/2015 | Elias et al. |
| 9,063,627 B2 | 6/2015 | Yairi et al. |
| 9,086,733 B2 | 7/2015 | Pance |
| 9,092,058 B2 | 7/2015 | Kasahara et al. |
| 9,158,426 B1 | 10/2015 | Woodhull et al. |
| 9,171,141 B2 | 10/2015 | Ferren |
| 9,189,078 B2 | 11/2015 | Mahowald et al. |
| 9,195,314 B2 * | 11/2015 | Sharma ................. G06F 1/1662 |
| 9,213,416 B2 | 12/2015 | Chen |
| 9,223,352 B2 | 12/2015 | Smith et al. |
| 9,235,236 B2 | 1/2016 | Nam |
| 9,274,654 B2 | 3/2016 | Slobodin et al. |
| 9,288,373 B2 | 3/2016 | Xie et al. |

(56) References Cited

U.S. PATENT DOCUMENTS

| | | | |
|---|---|---|---|
| 9,298,273 B2 | 3/2016 | Shao et al. | |
| 9,300,033 B2 | 3/2016 | Han et al. | |
| 9,305,496 B2 | 4/2016 | Kimura | |
| 9,348,425 B2 | 5/2016 | Chi et al. | |
| 9,349,551 B2* | 5/2016 | Nakajima | G06F 3/0202 |
| 9,360,891 B1 | 6/2016 | Van Der Merwe | |
| 9,405,369 B2 | 8/2016 | Modarres et al. | |
| 9,443,672 B2 | 9/2016 | Martisauskas | |
| 9,444,454 B2 | 9/2016 | Hovden | |
| 9,448,631 B2 | 9/2016 | Winter et al. | |
| 9,454,239 B2 | 9/2016 | Elias | |
| 9,471,185 B2 | 10/2016 | Guard | |
| 9,477,382 B2 | 10/2016 | Hicks et al. | |
| 9,612,664 B2 | 4/2017 | Croisonnier | |
| 9,612,674 B2 | 4/2017 | Degner et al. | |
| 9,704,665 B2 | 7/2017 | Brock et al. | |
| 9,704,670 B2* | 7/2017 | Leong | G06F 3/0202 |
| 9,710,069 B2 | 7/2017 | Leong et al. | |
| 9,720,505 B2 | 8/2017 | Gribetz et al. | |
| 9,746,923 B2 | 8/2017 | Cruz-Hernandez et al. | |
| 9,760,183 B2 | 9/2017 | Kawaguchi et al. | |
| 9,793,066 B1* | 10/2017 | Brock | H01H 13/83 |
| 9,848,494 B2 | 12/2017 | Huitema et al. | |
| 9,908,310 B2* | 3/2018 | Niu | B29C 70/78 |
| 9,910,211 B2 | 3/2018 | Kloeppel et al. | |
| 9,921,679 B2 | 3/2018 | Son et al. | |
| 9,927,895 B2 | 3/2018 | Ligtenberg et al. | |
| 9,934,915 B2 | 4/2018 | Cao et al. | |
| 9,941,879 B2 | 4/2018 | Lee et al. | |
| 9,948,297 B2 | 4/2018 | Bruwer | |
| 9,971,084 B2 | 5/2018 | Cao et al. | |
| 9,977,499 B2 | 5/2018 | Westerman et al. | |
| 9,996,199 B2 | 6/2018 | Park et al. | |
| 9,997,304 B2 | 6/2018 | Leong et al. | |
| 9,997,308 B2 | 6/2018 | Leong et al. | |
| 10,001,812 B2 | 6/2018 | Andre et al. | |
| 10,082,880 B1 | 9/2018 | Yarak, III et al. | |
| 10,114,489 B2 | 10/2018 | Ligtenberg et al. | |
| 10,134,539 B2 | 11/2018 | Leong et al. | |
| 10,175,771 B2 | 1/2019 | Barneron | |
| 10,254,851 B2 | 4/2019 | Leong et al. | |
| 10,284,196 B2 | 5/2019 | Hanssen et al. | |
| 10,353,485 B1 | 7/2019 | Zhang et al. | |
| 10,365,803 B2 | 7/2019 | Yao | |
| 10,444,834 B2 | 10/2019 | Vescovi et al. | |
| 10,556,408 B2 | 2/2020 | Niu et al. | |
| 10,564,721 B2 | 2/2020 | Cruz-Hernandez et al. | |
| 10,585,493 B2 | 3/2020 | Elias | |
| 10,615,793 B2 | 4/2020 | Kawaguchi et al. | |
| 10,755,877 B1 | 8/2020 | Wang et al. | |
| 10,775,850 B2 | 9/2020 | Wang et al. | |
| 10,796,863 B2 | 10/2020 | Stringer et al. | |
| 11,409,332 B2 | 8/2022 | Wang et al. | |
| 2002/0113770 A1 | 8/2002 | Jacobson et al. | |
| 2002/0149835 A1 | 10/2002 | Kanbe | |
| 2004/0004559 A1 | 1/2004 | Rast | |
| 2004/0041791 A1 | 3/2004 | Dunker | |
| 2004/0225965 A1 | 11/2004 | Garside et al. | |
| 2005/0253801 A1 | 11/2005 | Kobayashi | |
| 2006/0020469 A1 | 1/2006 | Rast | |
| 2007/0200823 A1 | 8/2007 | Bytheway et al. | |
| 2008/0131184 A1 | 6/2008 | Brown et al. | |
| 2009/0009482 A1 | 1/2009 | McDermid | |
| 2009/0046053 A1 | 2/2009 | Shigehiro et al. | |
| 2009/0262085 A1 | 10/2009 | Wassingbo et al. | |
| 2009/0267892 A1 | 10/2009 | Faubert | |
| 2010/0045705 A1 | 2/2010 | Vertegaal et al. | |
| 2010/0253630 A1 | 10/2010 | Homma et al. | |
| 2010/0321298 A1 | 12/2010 | Tsai et al. | |
| 2011/0115709 A1 | 5/2011 | Cruz-Hernandez | |
| 2011/0261031 A1 | 10/2011 | Muto | |
| 2012/0032972 A1 | 2/2012 | Hwang | |
| 2012/0080297 A1 | 4/2012 | Takeuchi et al. | |
| 2012/0092263 A1* | 4/2012 | Peterson | G06F 3/0443 345/168 |
| 2012/0286701 A1 | 11/2012 | Yang et al. | |
| 2012/0313856 A1 | 12/2012 | Hsieh | |
| 2013/0093733 A1 | 4/2013 | Yoshida | |
| 2013/0100030 A1 | 4/2013 | Los et al. | |
| 2013/0120265 A1 | 5/2013 | Horii et al. | |
| 2013/0141396 A1 | 6/2013 | Lynn | |
| 2013/0215079 A1 | 8/2013 | Johnson et al. | |
| 2013/0228023 A1 | 9/2013 | Drasnin et al. | |
| 2013/0275907 A1 | 10/2013 | Lau et al. | |
| 2014/0082490 A1 | 3/2014 | Jung et al. | |
| 2014/0191973 A1 | 7/2014 | Zellers et al. | |
| 2014/0218640 A1* | 8/2014 | Chi | G06F 3/0202 400/490 |
| 2014/0218851 A1 | 8/2014 | Klein et al. | |
| 2015/0010723 A1 | 1/2015 | Krishnan et al. | |
| 2015/0077343 A1* | 3/2015 | Shao | G06F 1/1662 73/862.381 |
| 2015/0192960 A1 | 7/2015 | Sharma | |
| 2015/0277504 A1 | 10/2015 | Odell | |
| 2015/0277620 A1 | 10/2015 | Bulea | |
| 2016/0011691 A1 | 1/2016 | Shinkai et al. | |
| 2016/0049266 A1* | 2/2016 | Stringer | H01H 13/7065 200/344 |
| 2016/0096195 A1 | 4/2016 | Barnes et al. | |
| 2016/0342223 A1* | 11/2016 | Barneron | G06F 21/86 |
| 2018/0074694 A1 | 3/2018 | Lehmann et al. | |

FOREIGN PATENT DOCUMENTS

| | | |
|---|---|---|
| CN | 200986871 | 12/2007 |
| CN | 101438228 | 5/2009 |
| CN | 101494130 | 7/2009 |
| CN | 101868773 | 10/2010 |
| CN | 201956238 | 8/2011 |
| CN | 102197452 | 9/2011 |
| CN | 102214038 | 10/2011 |
| CN | 202040690 | 11/2011 |
| CN | 102496509 | 6/2012 |
| CN | 10269527 | 8/2012 |
| CN | 102622089 | 8/2012 |
| CN | 202372927 | 8/2012 |
| CN | 102679239 | 9/2012 |
| CN | 102713805 | 10/2012 |
| CN | 102832068 | 12/2012 |
| CN | 102956386 | 3/2013 |
| CN | 103165327 | 6/2013 |
| CN | 103180979 | 6/2013 |
| CN | 203135988 | 8/2013 |
| CN | 103489986 | 1/2014 |
| CN | 203405773 | 1/2014 |
| CN | 203414880 | 1/2014 |
| CN | 103699181 | 4/2014 |
| CN | 203520312 | 4/2014 |
| CN | 203630729 | 6/2014 |
| CN | 103903891 | 7/2014 |
| CN | 204102769 | 1/2015 |
| CN | 105097341 | 11/2015 |
| CN | 205028245 | 2/2016 |
| CN | 105446646 | 3/2016 |
| CN | 206339935 | 7/2017 |
| DE | 3002772 | 7/1981 |
| DE | 202008001970 | 8/2008 |
| EP | 0441993 | 8/1991 |
| EP | 1835272 | 9/2007 |
| EP | 2426688 | 3/2012 |
| EP | 2439760 | 4/2012 |
| EP | 2463798 | 6/2012 |
| EP | 2664979 | 11/2013 |
| GB | 1361459 | 7/1974 |
| JP | H09204148 | 8/1997 |
| JP | H11194882 | 7/1999 |
| JP | 2000010709 | 1/2000 |
| JP | 2000339097 | 12/2000 |
| JP | 2003522998 | 7/2003 |
| JP | 2005108041 | 4/2005 |
| JP | 2006277013 | 10/2006 |
| JP | 2007514247 | 5/2007 |
| JP | 2007156983 | 6/2007 |
| JP | 2008100129 | 5/2008 |

(56) References Cited

FOREIGN PATENT DOCUMENTS

| | | |
|---|---|---|
| JP | 2008191850 | 8/2008 |
| JP | 2008533559 | 8/2008 |
| JP | 2010244088 | 10/2010 |
| JP | 2010244302 | 10/2010 |
| JP | 2011065126 | 3/2011 |
| JP | 2011165630 | 8/2011 |
| JP | 2012043267 | 3/2012 |
| JP | 2012063630 | 3/2012 |
| JP | 2012083840 | 4/2012 |
| JP | 2012088215 | 5/2012 |
| JP | 2012098873 | 5/2012 |
| JP | 2012230256 | 11/2012 |
| JP | 2013511108 | 3/2013 |
| JP | 2016053778 | 4/2016 |
| JP | 2016510547 | 4/2016 |
| KR | 20150024201 | 3/2015 |
| TW | 200703396 | 1/2007 |
| TW | M334397 | 6/2008 |
| TW | 201108284 | 3/2011 |
| TW | 201108286 | 3/2011 |
| TW | M407429 | 7/2011 |
| WO | WO 97/044946 | 11/1997 |
| WO | WO 05/057320 | 6/2005 |
| WO | WO 06/022313 | 3/2006 |
| WO | WO 07/049253 | 5/2007 |
| WO | WO 08/045833 | 4/2008 |
| WO | WO 09/005026 | 1/2009 |
| WO | WO 14/014158 | 9/2014 |

\* cited by examiner

COMPUTER WITH KEYBOARD

CROSS-REFERENCE TO RELATED APPLICATIONS

This application is a continuation of U.S. patent application Ser. No. 16/996,617, filed Aug. 18, 2020, which is a continuation of U.S. patent application Ser. No. 16/045,651, filed Jul. 25, 2018, now U.S. Pat. No. 10,775,850, which is a continuation of U.S. patent application Ser. No. 15/990,508, filed May 25, 2018, which is a nonprovisional patent application and claims the benefit of U.S. Provisional Patent Application No. 62/537,350, filed Jul. 26, 2017, the contents of which are incorporated herein by reference as if fully disclosed herein.

FIELD

The described embodiments relate generally to electronic devices, and more particularly to an electronic device having a keyboard with a flexible input surface.

BACKGROUND

Many electronic devices include keyboards to facilitate user input. Conventional keyboards include movable keys that are actuated by a user striking them with their fingers or another object. Some devices include touchscreens on which virtual keyboards may be displayed. Users may select individual keys of virtual keyboards by pressing on the part of the surface of the touchscreen that corresponds to a desired letter, character, or function. The surface of the touchscreen may be flat and featureless, and may thus occupy less space than a mechanical keyboard but may require users to identify the location of the keys by sight rather than by feel.

SUMMARY

A device may include a display portion that includes a display housing and a display at least partially within the display housing. The device may also include a base portion pivotally coupled to the display portion and including a bottom case, a glass top case coupled to the bottom case and defining an array of raised key regions, and a sensing system below the glass top case and configured to detect an input applied to a raised key region of the array of raised key regions. The array of raised key regions may form a keyboard of the device. The glass top case may further define a touch-input region along a side of the keyboard. The input may include a force applied to the raised key region of the array of raised key regions, and the raised key region may be configured to locally deflect in response to the applied force. The sensing system may be configured to detect the local deflection of the raised key region and detect touch inputs applied to the touch-input region.

The array of raised key regions may form a keyboard of the device, and the device may further include a support structure within the base portion, below the glass top case, and configured to resist deflection of the glass top case in a non-key region of the keyboard.

The raised key region may define a substantially planar top surface. The raised key region may be at least partially defined by a side wall that extends around the raised key region and is configured to deform in response to the input.

The device may further include a support structure positioned below a region of the glass top case that is between two adjacent raised key regions and the support structure may be configured to resist deflection of the region in response to a force applied to one of the two adjacent raised key regions.

The array of raised key regions may define a keyboard of the device and the glass top case may define a transparent portion along a side of the keyboard. The display may be a first display and the device may further include a second display positioned below the glass top case. The second display may be aligned with the transparent portion of the glass top case.

The glass top case may include a first glass layer defining the array of raised key regions and configured to deflect in response to a first force applied to the raised key region. The glass top case may also include a second glass layer below the first glass layer and configured to provide a buckling response in response to a second force, greater than the first force, applied to the raised key region.

A keyboard for an electronic device may include a bottom case, a glass top case coupled to the bottom case and defining an array of raised key regions, and a sensing system below the glass top case. A raised key region of the array of raised key regions may be configured to deflect in response to an actuation force applied to the raised key region, and the sensing system may be configured to detect the deflection of the raised key region. The raised key region may include a curved top surface. The raised key region may include a side wall extending from a base surface of the glass top case and supporting a top surface of the respective key region, and the side wall may be configured to deform in response to the actuation force. The keyboard may include a haptic actuator configured to impart a force to the raised key region in response to detection, by the sensing system, of the deflection of the raised key region.

The keyboard may further include a resilient member below the raised key region and configured to impart a returning force to the raised key region. The resilient member may provide a buckling response to the raised key region, and the buckling response may be provided in response to deflection of the raised key region beyond a threshold distance. The resilient member may be a collapsible dome.

A device may include a display portion comprising a display and a base portion hinged to the display portion. The base portion may include a bottom case and a glass top case coupled to the bottom case and defining an array of key regions, wherein a key region of the array of key regions is configured to produce a buckling response in response to an applied force. Each key region of the array of key regions may have a thickness that is less than about 40 μm.

The key region may define a top surface having a convex curved shape that is configured to collapse to provide the buckling response. The device may further include a spring below the key region and configured to impart a returning force to the key region. The device may further include a support structure supporting the glass top case relative to the bottom case and configured to prevent a force applied to the key region from buckling an additional key region that is adjacent the key region.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
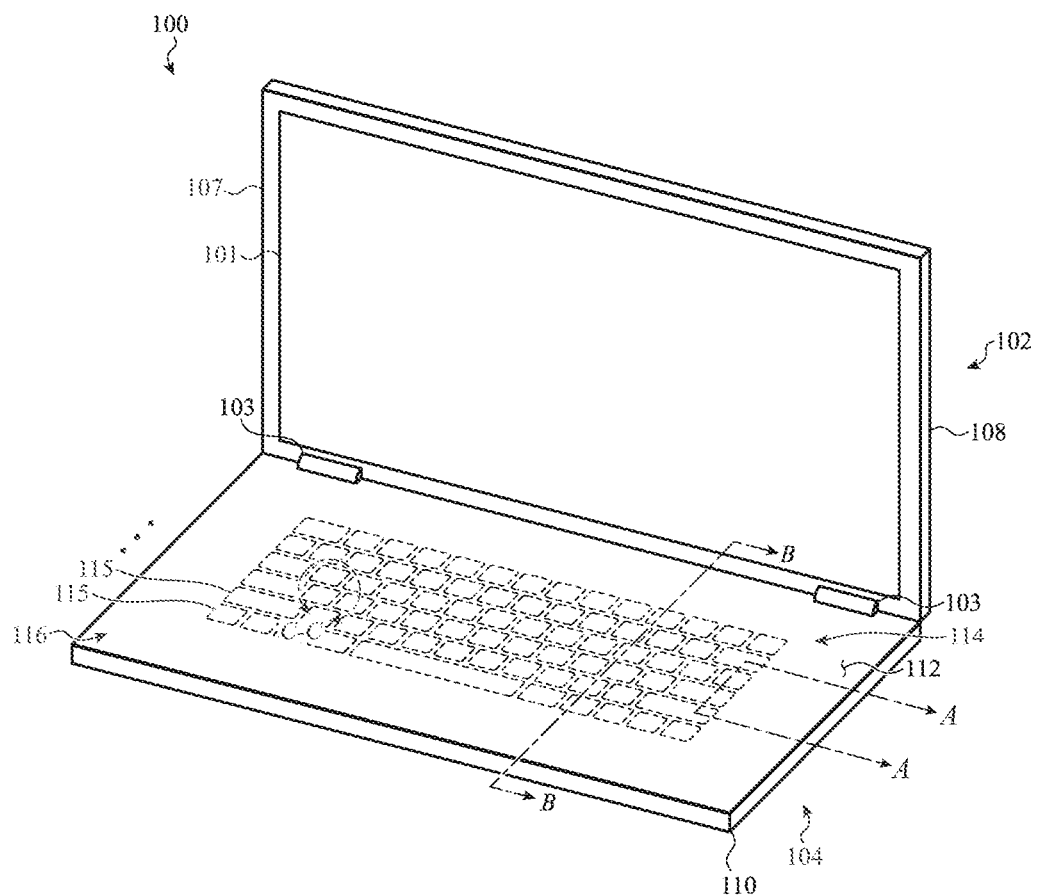
FIG. 1 depicts a simplified example of a computing device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are generally directed to a keyboard that includes a glass member that defines an input surface of the keyboard. In particular, a user may touch or apply a force (e.g., push or strike) or otherwise contact the glass member directly to provide inputs to the keyboard. The glass member, also referred to as a glass cover, may be formed from a thin glass sheet that is flexible enough to deform locally in response to applications of force. For example, the glass sheet may be a strengthened glass having a thickness of about 40 microns or less. Due to the thinness and flexibility of the glass, when a typical typing force is applied to the thin glass sheet (e.g., via a finger), the glass may be primarily deformed directly under the force (e.g., under the finger) while other areas of the glass sheet remain substantially undeformed or less deformed. The local deformation of the thin glass may provide a more satisfying typing experience than thicker or less flexible glass, as the user may actually feel a deformation or depression that is similar to or suggestive of a conventional movable-key keyboard. Moreover, the local deformation may produce a softer typing feel (e.g., a less jarring impact) than striking a less compliant surface, such as a conventional touchscreen.

In some cases, the glass cover of a keyboard may include protrusions, contours, recesses, and/or other shapes or features that define distinct key regions of the keyboard. For example, the glass cover may be thermoformed or otherwise processed to form an array of raised key regions (e.g., protrusions, contoured key regions, etc.) that define the key regions of a keyboard. Raised key regions may provide a more familiar-feeling keyboard surface to users, as the individual key regions may have a similar shape and feel to conventional movable keys. Moreover, a user may be able to type faster and with fewer errors because they can feel the borders and boundaries of each key region and do not need to look at the keyboard to align their fingers with the keys. The ability to feel distinct key regions may also help prevent a user's hands from unintentionally drifting out of position during typing.

Further, due to the flexibility of the thin glass cover, the raised key regions may be configured to deform in response to typing inputs. Such deformations may provide a similar tactile feeling to conventional movable-key keyboards. Further, the raised key regions may be configured to provide various types of tactile responses. For example, the key regions may be configured to have a shape that buckles, provides a buckling response, or otherwise produces a perceptible tactile output (e.g., a click or snap) when pressed. As used herein, "buckling," "buckling response," and "buckling force" may refer to a force response of a key region or input region characterized by a gradual increase in an opposing force as a key region or input region is pressed, followed by a sudden or pronounced decrease in the opposing force. The decrease in the opposing force results in the familiar "click" feeling and, optionally, sound. An example force versus deflection curve illustrating a buckling response is described herein with respect to FIG. 6C. As another example, the key regions may be configured not to buckle or have a distinctive force peak, thus providing a more continuous force feedback during typing.

Other features and benefits are also made possible by a glass cover for a keyboard as described herein. For example, because the glass may be transparent, a display may be placed under the glass cover. The display may allow the keyboard, as well as any other region of the glass cover, to act as a display in addition to an input device. The display may allow the computer to display different keyboard layouts, keyboard alphabets, keyboard colors, or otherwise change the appearance of the keyboard by displaying different images through the transparent glass. Furthermore, the dielectric properties of glass may allow for the use of various touch and/or force sensors under the glass cover to detect touch and/or force inputs (or other types of user inputs) to key regions, as well as inputs applied to other, non-key regions of the glass cover (e.g., a touch-input region below a keyboard). As used herein, a non-key region may correspond to areas of a cover that are not configured as key regions of a keyboard, including, for example, the areas between key regions (which may resemble a key web), areas outside of a keyboard region, or the like. The glass sheet may also present a surface that may be free from openings, which may help protect internal components from contaminants and spills.

FIG. 1 depicts a computing device 100 (or simply "device 100") that may include a glass cover, as described above. In particular, a base portion 104 of the device 100 may include a top case 112 (also referred to as a cover) that is formed at least partially from glass and that defines a keyboard and optionally other input regions (e.g., a trackpad or touch-input region) of the device 100.

The device 100 resembles a laptop computer that has a display portion 102 and a base portion 104 flexibly or pivotally coupled to the display portion 102. The display portion 102 includes a display housing 107 and a display 101 at least partially within the display housing 107. The display 101 provides a primary means of conveying visual information to the user, such as by displaying graphical user interfaces. The base portion 104 is configured to receive various types of user inputs (also referred to herein as inputs), such as touch inputs (e.g., gestures, multi-touch inputs, swipes, taps, etc.), force inputs (e.g., presses or other inputs that satisfy a force or deflection threshold), touch inputs combined with force inputs, and the like. Touch and/or force inputs may correspond to a user striking a key region or other input surface, similar to a conventional typing motion or action.

The base portion 104 may also provide outputs for conveying information to a user, such as with indicator lights, haptic output devices, displays mounted in the base portion 104, or the like. In some cases, providing various types of input and output via the base portion 104 is facilitated or enabled by using a glass top case 112 on the base portion 104, as described herein.

The display portion 102 and the base portion 104 may be coupled to one another such that they can be positioned in an open position and a closed position. In the open position, a user may be able to provide inputs to the device 100 via the base portion 104 while simultaneously viewing information on the display portion 102. In the closed position, the display portion 102 and the base portion 104 are collapsed against one another. More particularly, the display portion 102 and the base portion 104 may be hinged together (e.g., via a pivot or hinge mechanism 103) to form a clamshell device that can be moved between an open and a closed configuration.

As noted above, the base portion 104 may include a top case 112 coupled to a bottom case 110. The bottom case 110 may be formed from any suitable material, such as metal (e.g., magnesium, aluminum, titanium, etc.), plastic, glass or the like, and may define, along with the top case 112, a portion of an interior volume of the base portion 104. The top case 112 may be attached to the bottom case 110 in any suitable way, including adhesives, mechanical interlocks, joining members, fusion bonds, or the like.

The top case 112 may be formed at least partially, and in some cases entirely, from glass. The glass top case 112 may be configured to deflect or deform locally in response to input forces applied thereto. For example, the glass of the top case may be sufficiently thin and be formed into a shape that allows the top case to form depressions or otherwise deflect when a user presses on the glass. Thicker or more rigid glass, by contrast, may not deflect significantly in response to typical input forces applied by a user's fingers. Such unyielding glass surfaces may not produce a desirable tactile feel for typing inputs, and may not deflect enough to facilitate force sensing (such as where force is detected based on the amount of deflection of the glass). Accordingly, a thin glass top case, as described herein, can deflect locally, thereby providing both a desired tactile response (e.g., a feel that is similar to or suggestive of a movable-key keyboard) and the ability to detect touch inputs using mechanical means, such as domes, deflection sensors, and the like.

The top case 112 may be formed from one or more layers of strengthened glass (e.g., chemically strengthened, ion-exchanged, heat-treated, tempered, annealed, or the like). The glass may be thinner than about 100 μm, thinner than about 40 μm, or thinner than about 30 μm. The glass top case 112 may be configured to locally deflect or deform any suitable amount in response to a typing force. For example, the glass top case 112 may be configured to locally deflect about 0.1 mm, about 0.2 mm, about 0.3 mm, about 0.4 mm, about 0.5 mm, or any other suitable amount, in response to a sample typing force (e.g., 100 g, 250 g, 500 g, 1 kg, etc.).

The top case 112 may define or include input regions such as a keyboard region 114 and a touch-input region 116. The keyboard region 114 may include or define key regions 115, which may correspond to keys of a keyboard or other input regions. The top case 112, and in particular the keyboard region 114, may lack raised or otherwise protruding key regions (e.g., it may be smooth and/or substantially planar). In such cases, key regions 115 may be differentiated using ink, paint, dyes, textures, displays, or any other suitable technique. In other cases, the keyboard region 114 of the top case 112 may be shaped to define physically distinctive key regions 115. For example, as described herein, the top case 112 may include recesses, protrusions, borders, or other physical features on its exterior surface that define and/or delineate distinct key regions 115 and that can be felt by a user when typing on or otherwise touching the keyboard region 114. The top case 112 may instead or in addition include channels or grooves on its interior surface that correspond to distinct key regions. Such interior and exterior features may isolate or localize deformations caused by forces (e.g., typing forces) applied to the key regions 115. For example, a deformation of the top case 112 due to a force applied to a protrusion, which may resemble a keycap of a conventional keyboard, may be substantially isolated to that protrusion, thus providing a sensation to the user of pressing a conventional mechanical keyboard key.

In some cases, the entire top surface of the top case 112 may be touch and/or force sensitive, and may allow detection of touch inputs substantially anywhere along its top surface, including in a keyboard region as well as surrounding regions (e.g., the touch-input region 116). In addition to receiving or detecting inputs, the top case 112 may be configured to provide haptic, tactile, visual, auditory, or otherwise perceptible outputs to a user. For example, the top case 112 may include or be integrated with displays, light sources, haptic actuators, or the like, that provide outputs that are detectable via the top case 112. The composition and configuration of the top case 112 may facilitate and integrate these (and other) input and output functions. For example, a continuous, nonconductive top case 112 formed from a thin, deformable glass may allow inputs to be detected through the top case 112 while also providing tactile feedback in the form of key regions 115 that buckle, deflect, deform, or otherwise move in response to applied forces.

The top case 112 may define a continuous, unbroken top surface of the base portion 104. For example, the top case 112 may have no seams, openings, through-holes, or other discontinuities in the portion of the top case 112 that forms an exterior surface of the base portion 104. The top case 112 may extend to the outer edges of the base portion 104. Accordingly, the top case 112 may prevent or reduce the possibility of liquid, dust, dirt, or other contaminants or debris from entering the base portion 104 through the top surface of the top case 112.

The touch-input region 116 may be configured to detect touch- and/or force-based inputs, and may be or may include any portion of the top case 112, including substantially the entire top case 112 including the keyboard region 114, the touch-input region 116, or any other portion of the top case 112. In some cases, substantially the entire top case 112, from edge to edge, may define a touch-sensitive surface. In this way, touch or trackpad inputs, such as clicks, taps, gestures (e.g., swiping, pinching), and multi-touch inputs, may be detected on any portion of the top case 112, including on individual key regions 115 within the keyboard region 114 as well as on portions of the top case 112 outside of the keyboard region 114.

Figure 2:
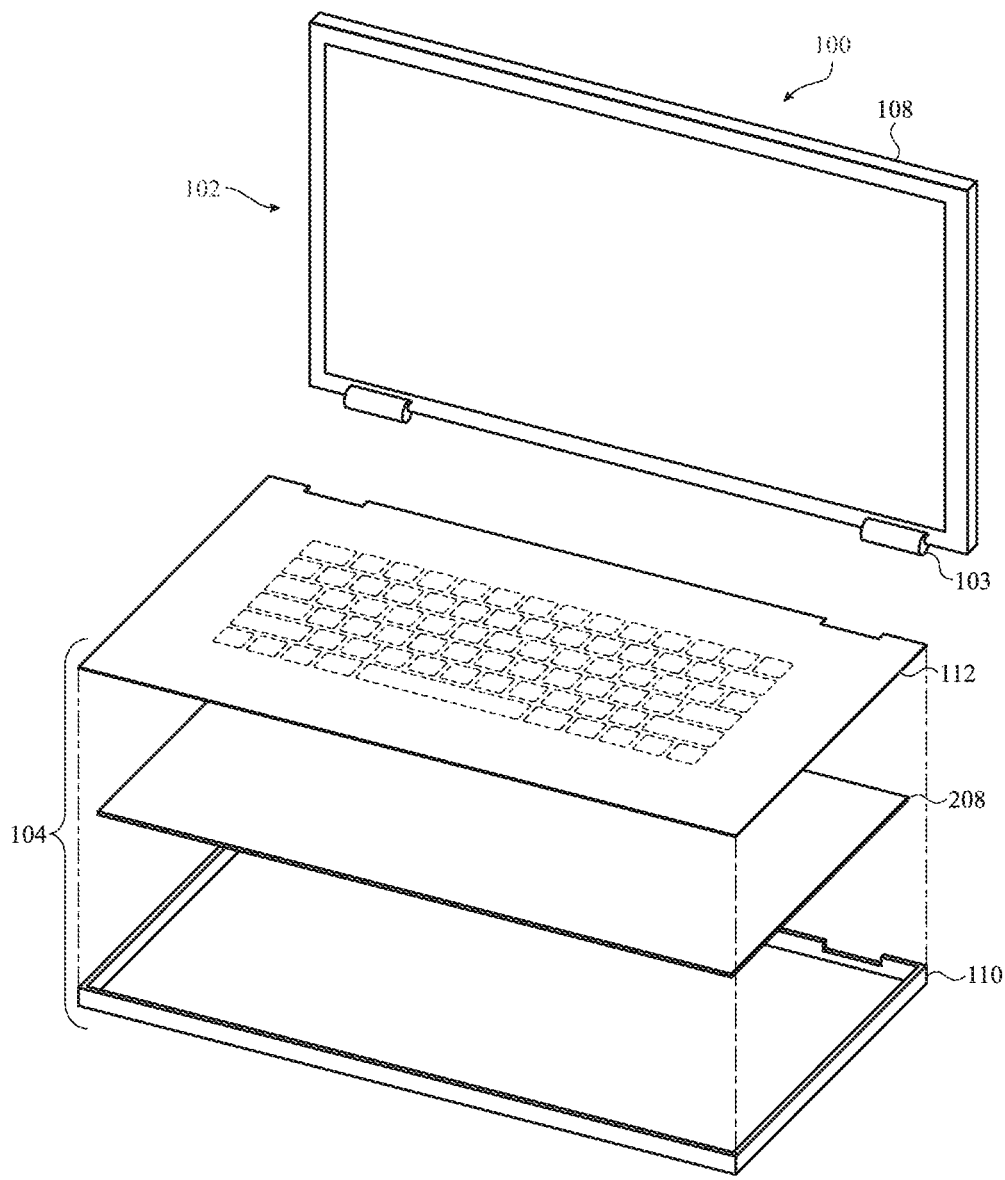
FIG. 2 depicts an exploded view of the computing device of FIG. 1.

FIG. 2 is a partial exploded view of the device 100. As described above, the device 100 includes a top case 112 that forms part of the base portion 104 and defines an array of key regions 115 (e.g., raised or otherwise physically or visually differentiated key regions, as described herein). As shown in FIG. 2, the base portion 104 is pivotally coupled to a display portion 102 via hinges 103 (or any other suitable mechanism) to form a foldable or clamshell type laptop or notebook computer.

The base portion 104 may include the bottom case 110 and the top case 112, described above, which together define an interior volume of the base portion 104. The base portion 104 may also include components 208 within the interior volume, such as processors, memory devices, batteries, circuit boards, input/output devices, haptic actuators, wired and/or wireless communication devices, communication ports, disk drives, and the like. As described above, the top case 112 may be a continuous surface (e.g., having no holes or openings in its top surface) to prevent or limit ingress of liquid, debris, or other contaminants into the interior volume, thereby reducing the chance of damage to the components 208. Examples of components that may be included in the components 208 are discussed herein with reference to FIG. 19.

Figure 3:
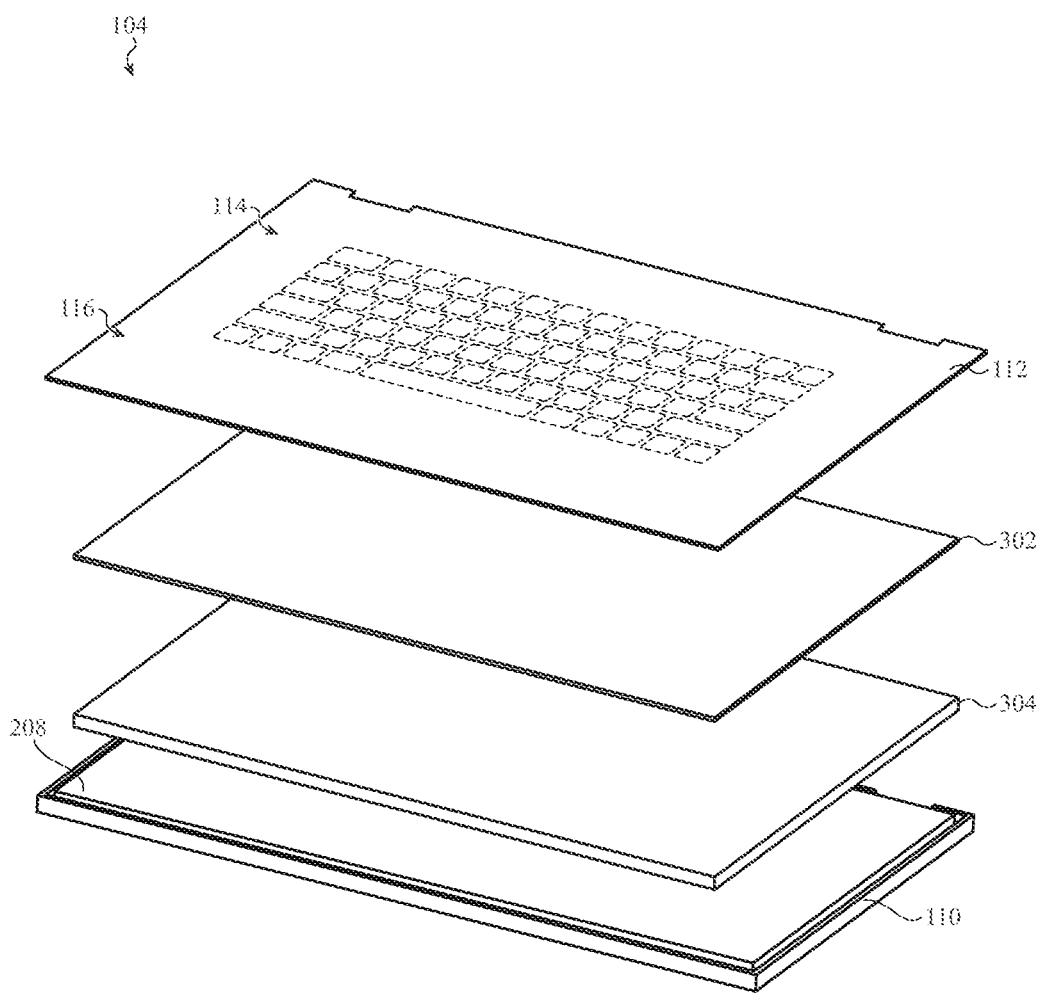
FIG. 3 depicts an exploded view of a base portion of the computing device of FIG. 1.

FIG. 3 depicts an exploded view of the base portion 104. The base portion 104 includes the top case 112, the bottom case 110, and a touch and/or force sensing system 302 below the top case 112 (e.g., disposed within the interior volume defined by the top case 112 and the bottom case 110). The touch and/or force sensing system 302 may provide touch and/or force sensing functionality to detect touch inputs and/or force inputs (and/or other types of user inputs) applied to the top case 112. For example, the touch sensing functions of the touch and/or force sensing system 302 may detect the presence and position of a touch input applied to the top case 112 (such as on the keyboard region 114), while the force sensing functions of may detect a magnitude (and optionally location) of a force input that results in a deformation of the top case 112.

The touch and/or force sensing system 302 may include any suitable components and may rely on any suitable force and/or touch sensing technologies, including capacitive, resistive, inductive, or optical sensing, electromechanical switches, collapsible domes, or any other suitable technology. Moreover, the touch and/or force sensing system 302, as depicted in FIG. 3, generically represents the one or more components that provide the touch and/or force sensing systems. While the touch and/or force sensing system 302 is depicted as a single block or component, in many implementations, the touch and/or force sensing system 302 would be formed from multiple components and/or layers. Thus, the touch and/or force sensing system 302 need not be configured as a sheet as shown in FIG. 3, but may take any physical form and may be integrated with the base portion 104 in any suitable way. For example, the touch and/or force sensing system 302 may be or may include an array of collapsible domes or switches, or an array of electroactive polymer switches, or the like. As another example, the touch and/or force sensing system 302 may include multiple sensors for detecting touch inputs (e.g., each sensor associated with a different region of a top case), as well as multiple sensors for detecting force inputs. Further, touch and force sensing functions may be provided by separate components or systems, or integrated into a single component or system.

The base portion 104 may also include an optional display 304 below the touch and/or force sensing system 302. The display 304 may be used to produce images on different regions of the top case 112, such as the keyboard region 114, a touch-input region 116, or the like. For example, the display 304 may produce images of characters, glyphs, symbols, keycaps, or other images that are visible through the top case 112 and that are optionally aligned with individual key regions 115. Because the display 304 can dynamically change what is displayed, different images may be displayed at different times, allowing the device 100 to display different keyboard layouts, different key glyphs, and the like. Where the base portion 104 includes the display 304, portions of the touch and/or force sensing system 302 and the top case 112 may be transparent or substantially transparent, and aligned with the display 304 or an active portion of the display 304, to allow the display 304 to be visible to a user through the top case 112.

Figure 4A:
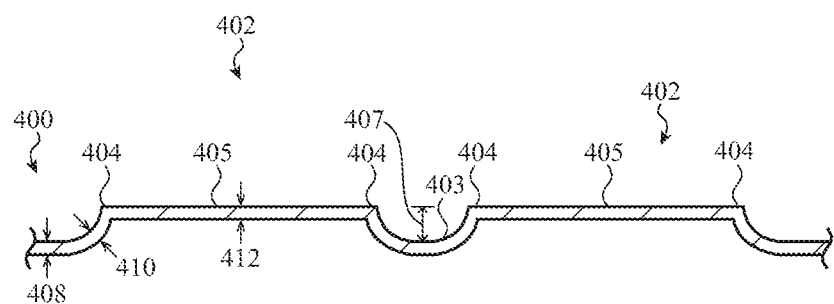
FIGS. 4A-4B depict an example configuration of a glass top case.
Figure 4B:
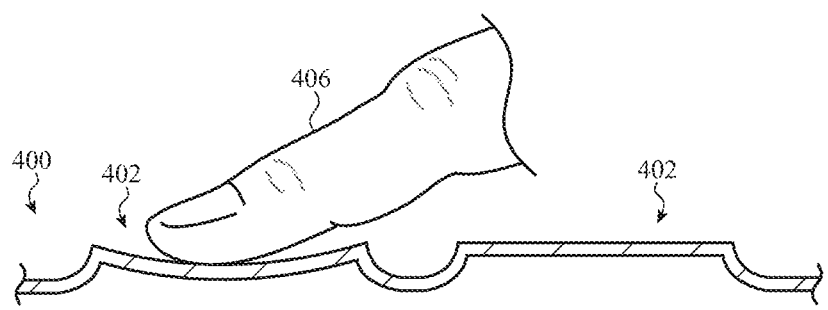
Figure 4C:
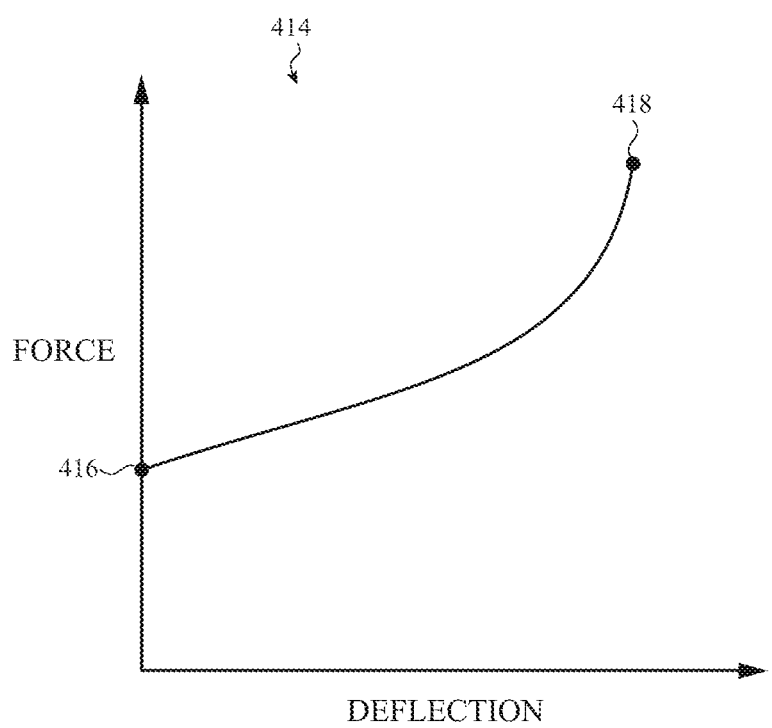
FIG. 4C depicts an example force versus deflection curve of a key region of the glass top case of FIGS. 4A-4B.

FIGS. 4A-4C relate to an example configuration of a glass top case 400 (which may correspond to the top case 112, FIG. 1, and which may be referred to simply as a top case 400) in which the glass is configured to deform in response to an actuation force applied to a key region (e.g., a protrusion 402) without producing a click or a "buckling" style tactile response. As described above, the top case 400 may be formed from a chemically strengthened glass having a thickness that facilitates localized deformation in response to actuation forces (e.g., finger presses on key regions). For example, the top case 400 may be formed from one or more layers of strengthened glass (e.g., chemically strengthened, ion-exchanged, heat treated, tempered, annealed, or the like), and may be thinner than about 100 μm, thinner than about 40 μm, or thinner than about 30 μm.

FIG. 4A is a partial cross-sectional view of a top case 400, corresponding to a view of a top case along line A-A in FIG. 1, showing an example in which key regions (e.g., key regions 115) are defined by protrusions 402 formed in the top case 400. The protrusions 402 may extend or otherwise protrude above a portion of the top case 400 that is adjacent the key regions.

The protrusions 402 protrude above a base level 403 of the top case 400 by a height 407. The height 407 may be about 0.5 mm, 0.2 mm, 0.1 mm, or any other suitable height. The protrusions 402 may include an edge 404 defining an outer perimeter of top surfaces 405 of the protrusions 402. The protrusions 402 may also include side walls (e.g., corresponding to item 410) that extend from a base level 403 (e.g., a surface of the top case 400 other than a protrusion 402) of the top case 400 to the top surfaces 405 of the protrusions 402. The side walls may support the top surface 405 of the protrusions 402. The side walls may be continuous side walls that extend around the periphery of the top surfaces 405. The side walls may provide structural rigidity for the key region. In some cases, as described herein, the side walls may buckle, flex, or otherwise deform to provide typing compliance and/or tactile feedback. For example, in some configurations, the side walls of a protrusion 402 may deform (e.g., to provide typing compliance and/or tactile feedback) while the top surface 405 of the protrusion 402 may remain substantially undeformed (or otherwise contribute less to the deflection of the protrusion 402 than the side walls). In such cases, the top surfaces 405 may be less flexible or deformable (e.g., stiffer) than the side walls.

As noted above, the protrusions 402 may provide useful tactile information to a user of the keyboard, as the individual key regions can be distinguished by touch, allowing the user to accurately and consistently locate their fingers on the key regions by feeling the edges or corners 404 of the protrusions 402.

The top case 400 may be processed in any suitable way to form the protrusions 402. For example, the top case 400 may be thermoformed, molded, machined, or otherwise processed to produce the desired shape. In some cases, the top case 400 has a substantially uniform thickness over at least a keyboard region of the top case 400 (e.g., the keyboard region 114, FIG. 1), and in some cases over the entire top case 400. For example, the thickness of the top case 400 at the base level (dimension 408), a side of a protrusion 402 (dimension 410), and a top portion of the protrusion 402 (dimension 412) may be substantially the same. In other cases, the top case 400 may have different thicknesses at different locations on the top case 400, such as a first thickness for dimension 412 and a different thickness for dimension 410. For example, the thickness of the side of a protrusion (dimension 410) may be less than that of the top portion (dimension 412) so that the side of the protrusion deforms more than the top portion of the protrusion in response to a force applied to the top surface 405.

FIG. 4B is another partial cross-sectional view of the top case 400, showing how the top case 400, and in particular a protrusion 402, may deform in response to a force applied on the top surface 405. In particular, FIG. 4B shows a finger 406 pressing on and deforming the protrusion 402, which may correspond to a typing input. The protrusion 402 may deform, as shown, while other portions of the top case 400 remain substantially undeformed or undeflected. In some cases, large-scale deflections of the whole top case 400 are resisted, limited or prevented by support structures that brace or otherwise support the top case 400 relative to another part of the device in which it is integrated (e.g., the bottom case 110). The shape of the deformed protrusion 402 shown in FIG. 4B is merely exemplary, and the protrusion 402 may have a shape or profile different that than shown when the protrusion 402 is deformed.

As noted above, the top case 400 may be configured to deform without producing a buckling or collapsing output. FIG. 4C shows a force versus deflection (e.g., travel) curve 414 characterizing the force response of the protrusion 402 as it is deformed. In particular, as an actuation force (e.g., from the finger 406) causes the protrusion 402 to deform downwards, the force response of the protrusion 402 increases along a path from point 416 to point 418. As shown, the path is increasing (e.g., has a positive slope) along the travel without a sudden or pronounced decrease in force, and thus does not collapse or produce a buckling response (e.g., a "click"). In some cases, as described herein, haptic actuators or other components may be used with top cases that have non-buckling configurations to produce tactile responses that simulate a buckling response or otherwise indicate that an input has been detected and registered by the keyboard.

While FIGS. 4A-4B show one example configuration of a top case with non-buckling key regions, other top cases with non-buckling key regions may have different configurations, protrusion shapes, recesses, or other features. FIGS. 5A-5H show a variety of such examples. In the examples shown in FIGS. 5A-5H, where the key regions are defined by or include ridges or side walls, the side walls may be configured so that they do not collapse or buckle in response to normal typing forces. In some cases, the side walls or ridges that define the key regions may have a greater stiffness than the top surfaces. The higher stiffness of the side walls may help isolate and/or localize deflections to a top surface. In some cases, the side walls or ridges may be less stiff than the top surface, which may result in deformation being substantially isolated to the side walls. This may result in the top surface deflecting in a more uniform manner (e.g., it may not substantially curve or bend). In yet other cases, the side walls or ridges are not appreciably stiffer than the top surface, and the deflection of the key region may include deflection of both the top surface and the side walls. In any of these embodiments, as noted above, the deflection of the top surface and/or the side walls may not produce a buckling response or other abrupt reduction in force response.

Except where specifically noted, all of the example top cases shown in FIGS. 5A-5H may be formed of glass and may have a substantially uniform thickness (e.g., less than about 100 μm, 40 μm, 30 μm, or any other suitable dimension). The glass may be any suitable glass, such as strengthened glass (e.g., chemically strengthened, ion-exchanged, heat treated, tempered, annealed, or the like).

Figure 5A:
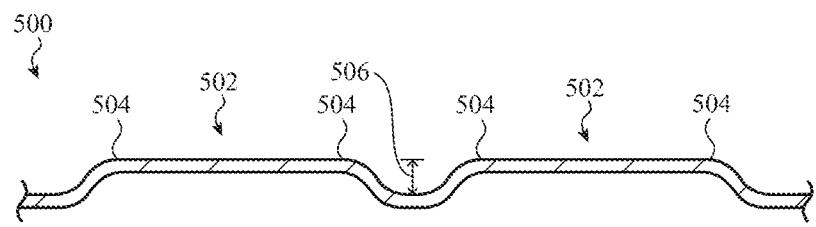
FIGS. 5A-5H depict cross-sectional views of example glass top cases.

FIG. 5A shows a partial cross-sectional view of a top case 500 (which may correspond to the top case 112, FIG. 1) that defines protrusions 502. The protrusions 502 are similar to the protrusions 402 in FIGS. 4A-4B, but have edges 504 that have a greater radius of curvature between the side wall and the top surface than the edges 404 in FIGS. 4A-4B. The rounded edges 504 may produce a different feel to the user, and may have greater resistance to chipping, breaking, cracking, or other damage. In some cases, the radius of the rounded edges 504 may be about 10 μm, 5 μm, or any other suitable dimension that produces a noticeably rounded edge (e.g., not a sharp, discontinuous corner). The protrusions 502 of the top case 500 may protrude above a base level of the top case 500 by a height 506. The height 506 may be about 0.5 mm, 0.2 mm, 0.1 mm, or any other suitable height.

Figure 5B:
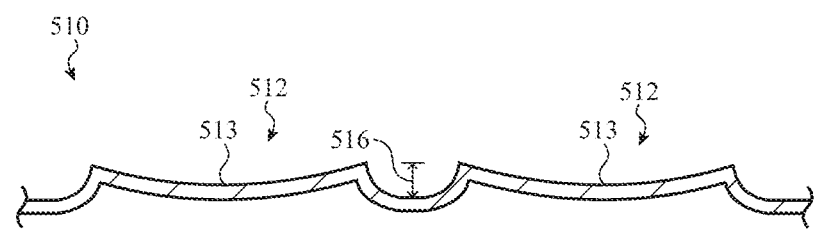

FIG. 5B shows a partial cross-sectional view of a top case 510 (which may correspond to the top case 112, FIG. 1) that defines protrusions 512. The protrusions 512 are similar to the protrusions 402 in FIGS. 4A-4B, but have concave top surfaces 513 instead of the substantially planar top surfaces 405. The concave top surfaces 513 may provide comfortable surfaces that generally match the shape of a user's fingertip. The concave top surfaces 513 may have a substantially cylindrical profile, a substantially spherical profile, or any other suitable shape. The protrusions 512 of the top case 510 may protrude above a base level of the top case 510 by a height 516. The height 516 may be about 0.5 mm, 0.2 mm, 0.1 mm, or any other suitable height. While FIG. 5B shows concave top surfaces 513, in other implementations the top surfaces may be convex.

Figure 5C:
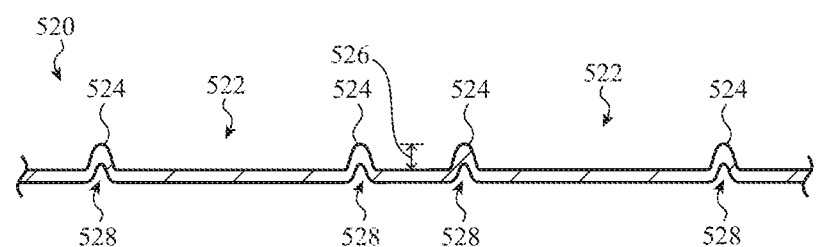

FIG. 5C shows a partial cross-sectional view of a top case 520 (which may correspond to the top case 112, FIG. 1) that defines protrusions 524 that extend around and define key regions 522. Whereas the protrusions in the top cases 400, 500, 510 defined key regions that were raised relative to a surrounding or adjacent portion of the top case, the protrusions 524 of the top case 520 extend around a surface that is substantially flush or even with nearby portions of the top case (e.g., the area of the top case 520 between the key regions 522. This may provide a shorter stack height for the top case 520, and thus a shorter height of the device in which it is incorporated.

Because the protrusions 524 define and/or extend around the key regions 522, users may be able to differentiate the key regions 522 by touch, allowing faster typing, easier finger alignment, and the like. The protrusions 524 may be any height 526 above a base level of the top case 520 (e.g., the top surfaces of the key regions 522 or the regions that are between the protrusions 524 and extend around the key regions 522), such as about 0.5 mm, 0.2 mm, 0.1 mm, 0.05 mm, or any other suitable height. The recesses 528 may be an artifact of a process used to form the top case 520, such as thermoforming or molding a glass sheet of a uniform thickness, or they may be machined into the bottom surface of the top case 520.

As shown, the top case 520 may have complementary recesses 528 below the protrusions 524, and the top case 520 may have a substantially uniform thickness, as described above. The curved portions of the top case 520 that define the protrusions 524 and complementary recesses 528 may serve as flexible joints that facilitate deflection of the key regions 522 relative to a remainder of the top case 520. In some cases, the portions of the top case 520 defining the protrusions 524 and recesses 528 are thinner than surrounding areas, which may produce more top case deformation in response to a given force.

In other cases, the top case 520 may include the protrusions 524 but maintain a substantially planar bottom layer (e.g., omitting the recesses 528). This configuration may stiffen the glass around the key regions 522, which may aid in isolating and localizing deflection of the key regions 522 in response to applications of force.

Figure 5D:
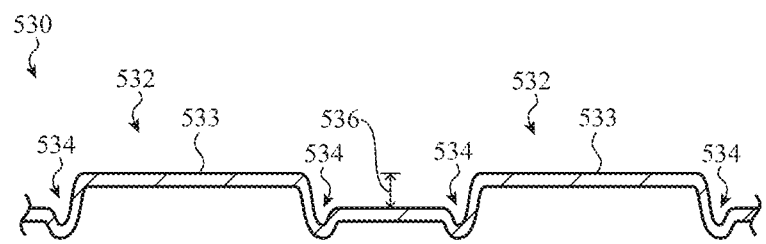

FIG. 5D shows a partial cross-sectional view of a top case 530 (which may correspond to the top case 112, FIG. 1) with key regions 532 defined by a protruding portion 533 and a recessed portion 534. The recessed portions 534 may extend around the protruding portions 533, and may serve as flexible joints that facilitate deflection of the key regions 532 relative to a remainder of the top case 530. The recessed portions 534 may also serve to visually and tactilely distinguish the key regions 532 from one another. The protruding portions 533 may be any height 536 above a base level of the top case 530, such as about 0.5 mm, 0.2 mm, 0.1 mm, 0.05 mm, or any other suitable height. Also, the top case 530 may have a substantially uniform thickness, or it may have different thicknesses at different locations. For example, the glass forming the recessed portions 534 and the sides of the protruding portions 533 may be thinner than or thicker than the glass between the key regions 532.

Figure 5E:
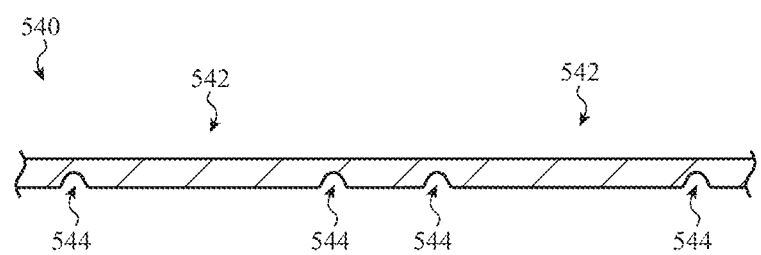

FIG. 5E shows a partial cross-sectional view of a top case 540 (which may correspond to the top case 112, FIG. 1) with key regions 542 that are defined, on a bottom surface of the top case 540, by recesses 544. The top surface of the top case 540 may be substantially planar or featureless. The recesses 544 may visually define the key regions 542 on the top case 540. In particular, if the top case 540 is transparent or translucent glass, the recesses 544 may be visible through the glass material. The recesses 544 may also define areas of thinner glass, which may increase the amount of deformation of the top case 540 in response to forces applied to the key regions 542 as compared to a top case having a uniform thickness. Moreover, the recesses 544 may aid in isolating and localizing deflection of the key regions 542 in response to forces applied to the key regions 542.

Figure 5F:
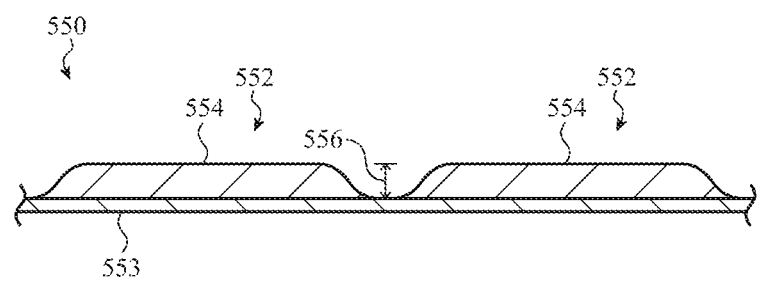

FIG. 5F shows a partial cross-sectional view of a top case 550 (which may correspond to the top case 112, FIG. 1) with key regions 552 that are defined by protrusions formed by attaching pads 554 to a substrate 553. The substrate 553 may be formed from glass (such as a strengthened glass) and may have a thickness that promotes localized deformation of the substrate 553 in response to applied forces (e.g., less than about 40 µm). The pads 554 may protrude above a top surface of the substrate 553 by a height 556 (e.g., about 0.5 mm, 0.2 mm, 0.1 mm, or any other suitable height).

The pads 554 may be any suitable material, such as glass, metal, plastic, ceramic, sapphire, or the like, and may be attached to the substrate 553 using adhesive, fusion bonding, intermolecular forces (e.g., hydrogen bonds, Van der Waals forces, etc.), or any other suitable technique. As shown, the pads 554 are a single component. In other cases, they may comprise multiple components or members, such as multiple layers of the same or different materials. The pads 554 may be transparent or opaque, and may have the same or a contrasting appearance (e.g., color, texture, material, opacity, etc.) as the substrate 553. In some cases, the pads 554 and the substrate 553 may be a monolithic component (e.g., formed from a single, continuous sheet of glass).

The pads 554 may provide several functions. For example, they may visually and tactilely differentiate different key regions 552, as described herein. In some cases, glyphs or other indicium may be formed on the top of the substrate 553 or the bottom of the pads 554 (or otherwise positioned between the substrate 553 and the pads 554), which may be visible through the pads 554. Further, the pads 554 may increase the stiffness or resistance to deformation of the substrate 553 in the key regions 552. This may help provide a more uniform or flat deflection of the key regions 552 in response to force applications. For example, instead of forming a curved divot in the substrate 553, the pads 554 may cause a deformation with a more planar shape due to the resulting increased stiffness in the key regions 552.

Figure 5G:
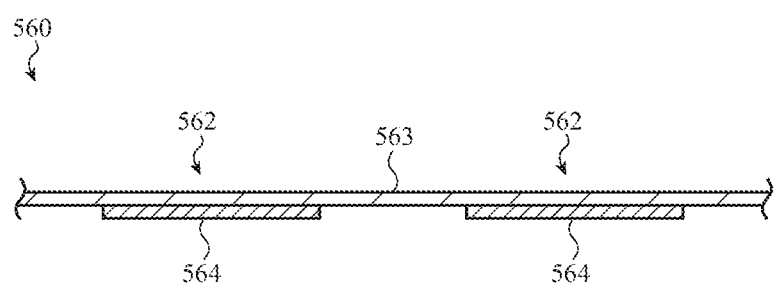

FIG. 5G shows a partial cross-sectional view of a top case 560 (which may correspond to the top case 112, FIG. 1) with key regions 562 that are defined by pads 564 coupled to a bottom surface of a substrate 563. The pads 564 and the substrate 563 may be substantially similar to the pads 554 and substrate 553 described with respect to FIG. 5F, and may have similar materials, dimensions, and functions. For example, the pads 564 may increase the stiffness or resistance to deformation of the substrate 563 in the key regions 562. Also, in cases where the substrate 563 is transparent, the pads 564 may be visible through the substrate 563 to visually distinguish the key regions 562.

Figure 5H:
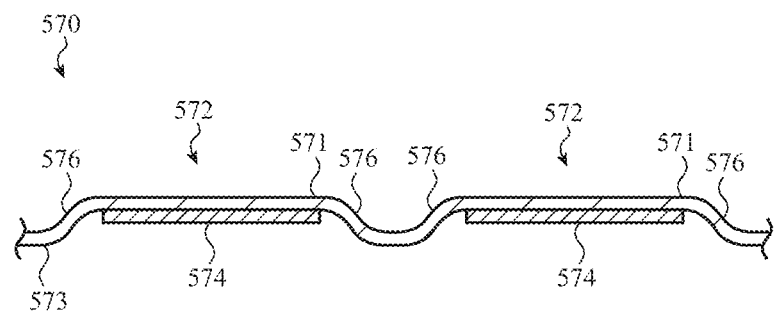

FIG. 5H shows a partial cross-sectional view of a top case 570 (which may correspond to the top case 112, FIG. 1) with key regions 572 defined by protrusions 571 formed in a substrate 573. The top case 570 also includes pads 574 positioned on a bottom surface of the protrusions 571 and aligned with an input surface of the protrusions 571. The substrate 573 may be substantially similar to the top case 500 described above with respect to FIG. 5A, and may have similar materials, dimensions, and functions. The pads 574 may be substantially similar to the pads 554 and 564 (FIGS. 5F, 5G), and may likewise have similar materials, dimensions, and functions. For example, the pads 574 may be formed from or include glass and may be bonded to the glass substrate 573. The pads 574 may locally stiffen the substrate 573 to increase the uniformity of the deformation of the substrate 573 in response to applications of force, and may also direct or isolate deformations to certain areas of the substrate 573, such as the sides 576 of the protrusions 571.

As noted above, the foregoing example top case configurations may be configured to have non-buckling key regions. Due to the thinness and relative deformability of the glass used for the top case, however, glass top cases as described herein may be configured to have key regions that buckle, collapse, or otherwise produce a tactile "click" when pressed. FIGS. 6A-7F illustrate example top case configurations that have buckling key regions.

Figure 6A:
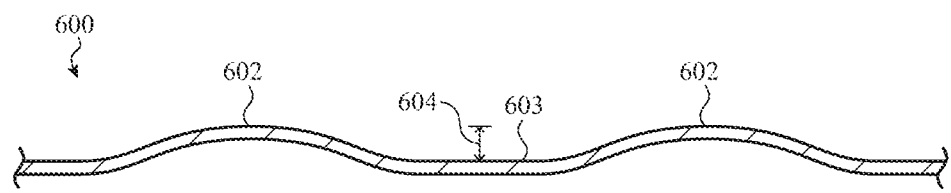
FIGS. 6A-6B depict another example configuration of a glass top case.

FIG. 6A is a partial cross-sectional view of a top case 600, corresponding to a view of a top case along section A-A in FIG. 1, showing an example in which key regions (e.g., key regions 115, FIG. 1) are defined by convex or dome-shaped protrusions 602 formed in the top case 600. As described with respect to FIG. 6C, these key regions (as well as those shown in FIGS. 7A-7F) may be configured to produce a buckling response.

The dome-shaped protrusions 602 protrude above a base level 603 of the top case 600 by a height 604. The height 604 may be about 0.5 mm, 0.2 mm, 0.1 mm, or any other suitable height. As noted above, the protrusions 602 may provide useful tactile information to a user of the keyboard, as the individual key regions can be distinguished by touch, allowing the user to accurately and consistently locate their fingers on the key regions by feeling the protrusions 602.

Figure 6B:
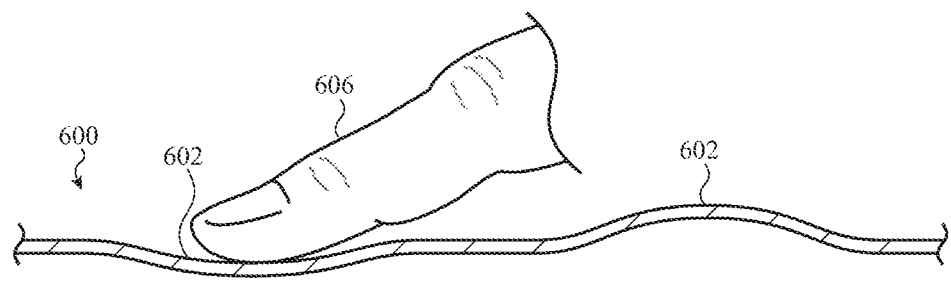

FIG. 6B is another partial cross-sectional view of a top case 600, showing how the top case 600, and in particular a protrusion 602, may deform in response to a force applied thereto. In particular, FIG. 6B shows a finger 606 pressing on and deforming the protrusion 602, which may correspond to a typing input. The protrusion 602 may deform, as shown, while other portions of the top case 600 remain substantially undeformed or undeflected.

Figure 6C:
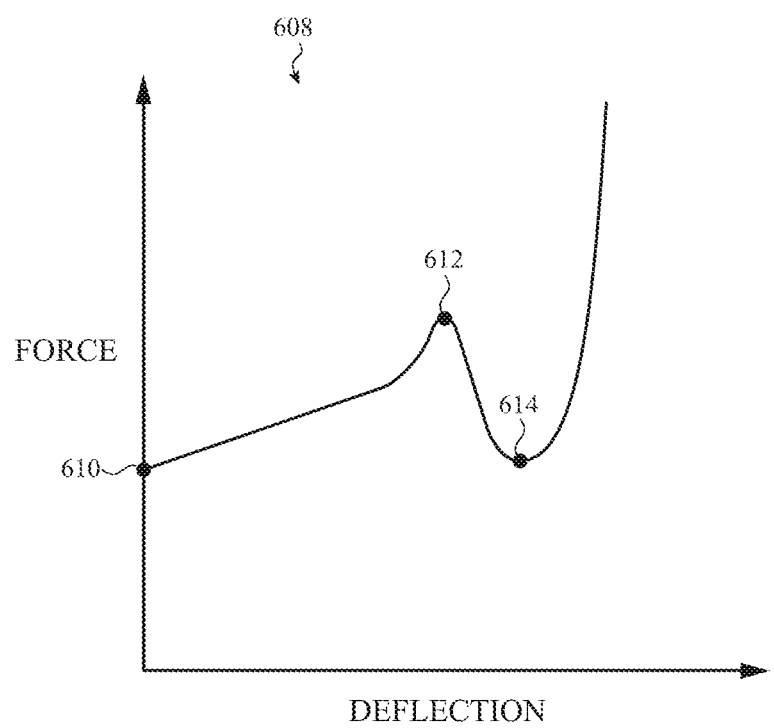
FIG. 6C depicts an example force versus deflection curve of a key region of the glass top case of FIGS. 6A-6B.

FIG. 6C shows a force versus deflection (e.g., travel) curve 608 characterizing the force response of the protrusion 602 as it is deformed. In particular, as an actuation force (e.g., from the finger 606) causes the protrusion 602 to deform downwards, the force response of the protrusion 602 increases along a path from point 610 until an inflection point 612 is reached. When the inflection point 612 is reached, the protrusion 602 collapses or buckles and the force response of the protrusion abruptly decreases along a path from point 612 to point 614. The inflection point 612 may define or correspond to a deflection threshold of the protrusion. For example, once the deflection of the key region reaches or passes beyond a threshold distance (e.g., corresponding to the inflection point 612), the protrusion 602 buckles and provides a buckling response to the key region.

After point 614, the force response begins to increase again (e.g., once the protrusion 602 is inverted and the glass ceases to deform as easily). This force response may produce a sudden or pronounced decrease in force that resembles the click of a mechanical keyboard, and thus may produce a typing experience that is similar to or suggestive of using a movable-key keyboard, despite the unitary structure of the glass top case.

Under normal operating conditions and forces, a device may detect an input (e.g., register that a key has been pressed) at point 612, where the force begins to drop off, or at point 614, where the force begins to increase again. As described herein, any suitable sensor or sensing system may be used to detect deformations of a top case and determine when to register an input, including touch sensors, force sensors, optical sensors, and the like.

Figure 7A:
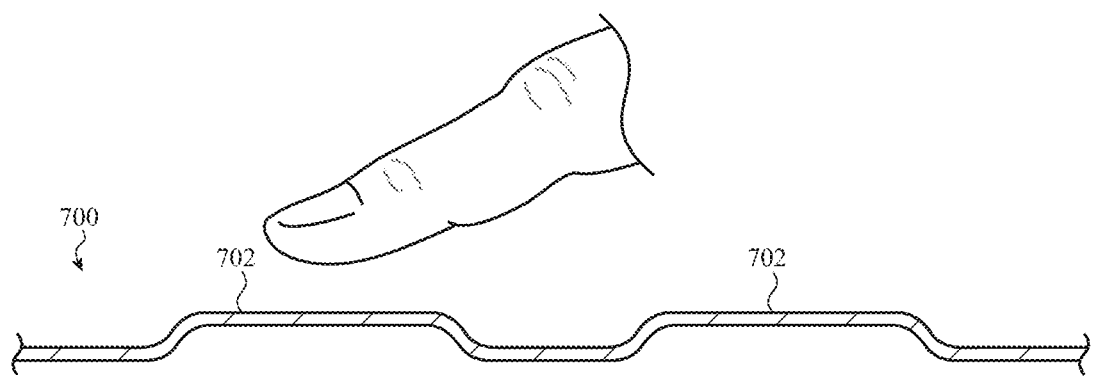
FIGS. 7A-7F depict cross-sectional views of other example glass top cases.
Figure 7B:
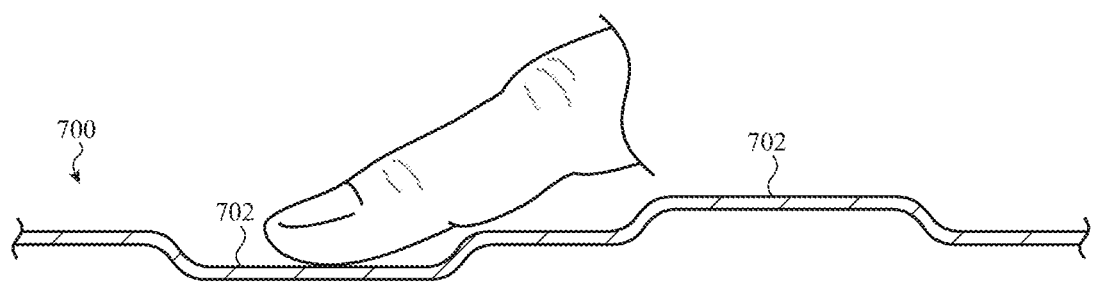

FIGS. 7A-7F show additional examples of top case shapes that may produce buckling-style tactile outputs, as well as example geometries of the top cases when deflected past an inflection point as described with respect to FIG. 6C. In particular, FIGS. 7A-7B show partial cross-sectional views of a top case 700 that includes protrusions 702 similar to those of the top case 500 (FIG. 5A). The protrusions 702 may be configured so that they invert and buckle when deformed. This may be achieved by selecting different dimensions for the protrusions 702 as compared to those shown in FIG. 5A, such as a greater height, more gently curved protrusion side walls, thinner side walls, a smaller top surface (e.g., in a horizontal direction, as shown), or the like.

Figure 7C:
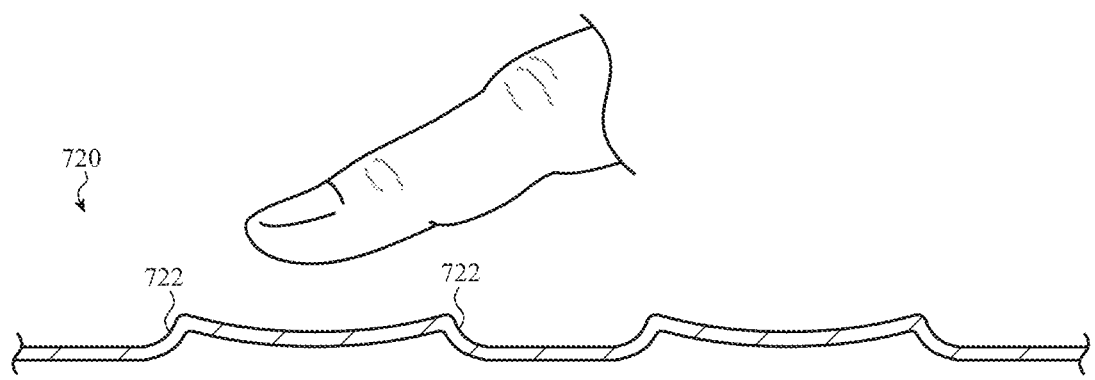
Figure 7D:
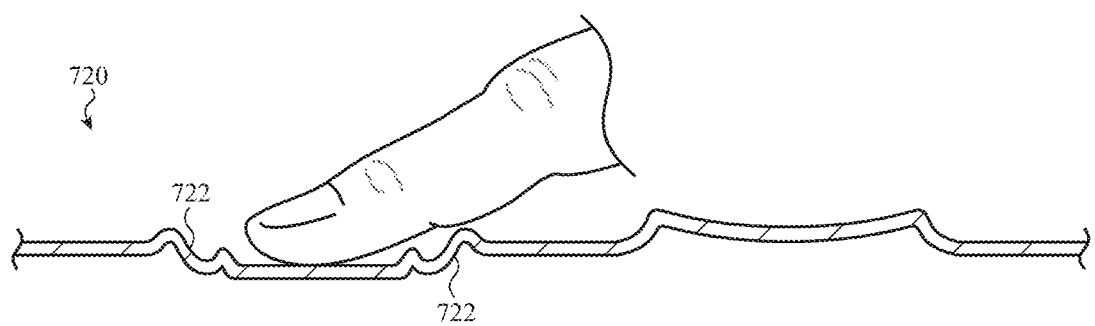

FIGS. 7C-7D show partial cross-sectional views of a top case 720 that resembles the top case 510 (FIG. 5B), but has been configured to have a buckling mode. For example, the protrusions may be differently sized, and/or the sides 722 of the protrusions may have different dimensions and/or material properties (e.g., different thicknesses, different heights, different radii of curvature, different stiffness) that produce a buckling deformation when pressed, as shown in FIG. 7D.

Figure 7E:
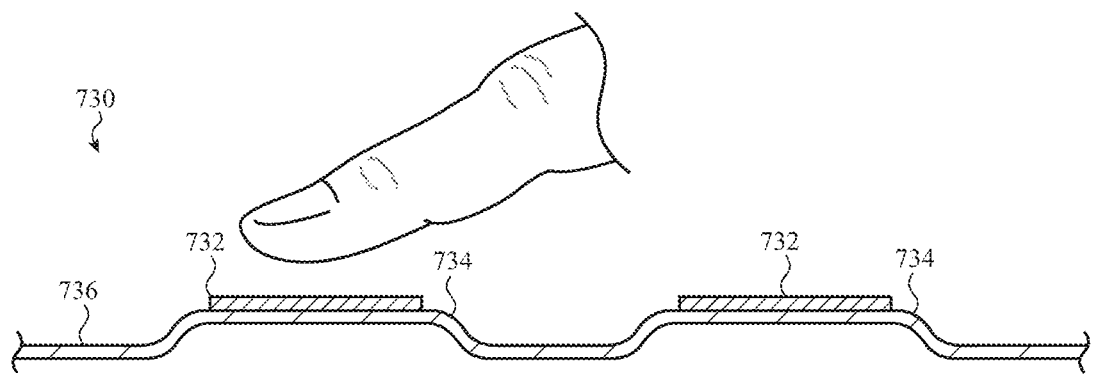
Figure 7F:
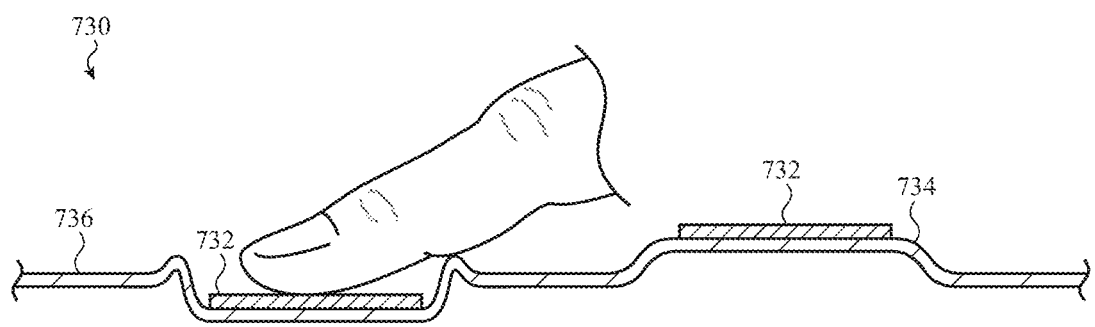

FIGS. 7E-7F show partial cross-sectional views of a top case 730 that includes protrusions 734 with pads 732 on a top surface of the protrusions 734. The pads 732 may be similar to the pads 564 and 574 described herein, and may be formed from the same materials, be coupled to a substrate 736, and provide the same functions of the pads 564 and 574. In some cases, the stiffening function of the pads 732 causes the underlying substrate 736 to produce a different deflection mode than would be produced without the pads 732. For example, the increased stiffness of the protrusions 734 where the pads 732 are attached may cause deformations to be isolated to the side walls of the protrusions 734, which may result in a buckling type of deformation and force response (as shown in FIG. 7F), rather than a linear or continuous force response (e.g., as shown in FIGS. 4A-4C).

In some cases, resilient members may be incorporated into a device using a deformable glass top case in order to increase or change the force response of the key regions of the top case. For example, springs, domes, elastomeric materials, or the like, may be provided below the top case. Such resilient members may provide a returning force to protrusions formed in the top case. For example, where the protrusions of a top case are configured to invert (e.g., collapse or buckle), the protrusions may not return to their original, protruding orientation without a returning force. Accordingly, resilient members may bias the protrusions towards an undeflected or undeformed position to ready the protrusion to receive another input. In examples where the top case is not configured to collapse or buckle, resilient members may be used to change the force response, for example, to increase the amount of force it takes to deform the top case a certain amount, or to change a spring rate or other property of the force response of the top case.

Figure 8A:
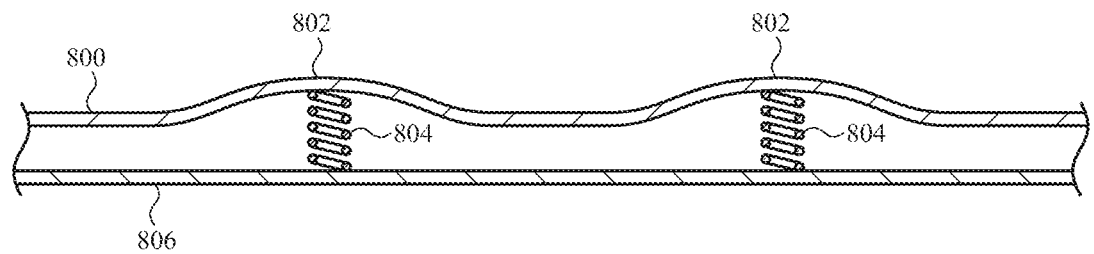
FIGS. 8A-8D depict example cross-sectional views of glass top cases with resilient members aligned with key regions.
Figure 8B:
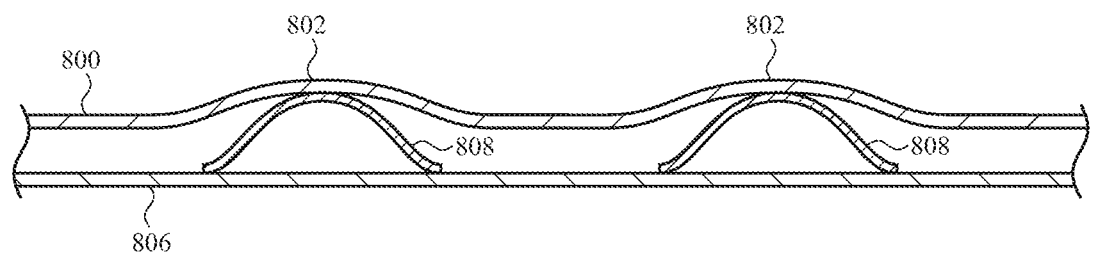
Figure 8C:
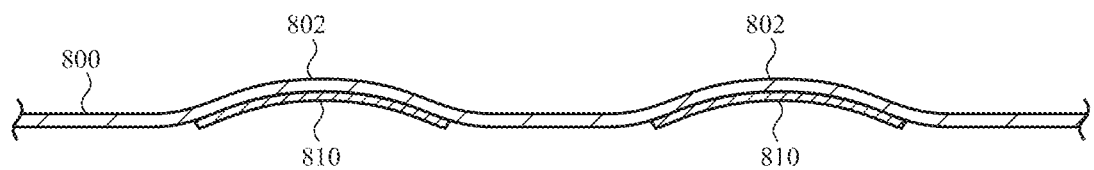

FIGS. 8A-8C show partial cross-sectional views of an example top case 800 having various types of resilient members interacting with protrusions in the top case to, for example, impart a returning force on the protrusions. Resilient members may be configured to deform or compress when a force is applied and return to an original state or shape when the force is removed. Examples of resilient members are described herein. The protrusions 802 in the top case 800 may be configured to buckle or collapse, as described with respect to FIGS. 6A-6C, or deform without buckling or collapsing, as described with respect to FIGS. 4A-4C.

For example, FIG. 8A shows a top case 800 with coil springs 804 aligned with protrusions 802. The coil springs 804 may be supported by a lower member 806, which may correspond to a bottom case of an enclosure (e.g., the bottom case 110, FIG. 1), or any other component or structure of an electronic device. The coil springs 804 may be metal, rubber, plastic, or any other suitable material, and may have any suitable spring rate, including linear spring rates, nonlinear spring rates, and the like. As noted, the coil springs 804 may provide a returning force to the protrusions 802.

FIG. 8B shows the top case 800 with domes 808 aligned with the protrusions 802. The domes 808 may be collapsible domes (e.g., domes that follow a force versus deflection curve similar to that shown in FIG. 6C), or they may be spring domes that do not collapse or otherwise produce a tactile "click." In cases where the top case 800 does not provide a buckling force response (e.g., as described with respect to FIGS. 6A-6C), collapsible domes may be used to produce a tactile "click" despite the top case itself not providing a buckling-style force response. This may permit the use of different shapes for the key regions (e.g., protrusions, recesses, featureless layers, etc.), which may not be sufficient alone to produce a tactile click, while still providing the tactile feel of a collapsing dome. The domes 808 may have any suitable shape and may be formed from any suitable material, including metal, rubber, plastic, carbon fiber, or the like.

FIG. 8C shows the top case 800 with plate springs 810 aligned with and attached to a bottom surface of the protrusions 802. The plate springs 810 may be strips or pads of metal, carbon fiber, plastic, or any other suitable material, and may be attached to the top case 800 in any suitable manner, including adhesives, fusion bonding, mechanical attachments, or the like. In some cases, the plate springs 810 may conform to the shape of the underside of the protrusions 802 such that the plate springs 810 are in substantially complete contact with the bottom surface of the top case 800. The plate springs 810 may resist deformation in a manner that imparts a returning force on the protrusions 802. As noted above, the returning force may be configured to return a buckled or collapsed protrusion to a rest (e.g., upwardly protruding) position, or to increase, change, or modify a force response of a non-buckling protrusion or top case.

Figure 8D:
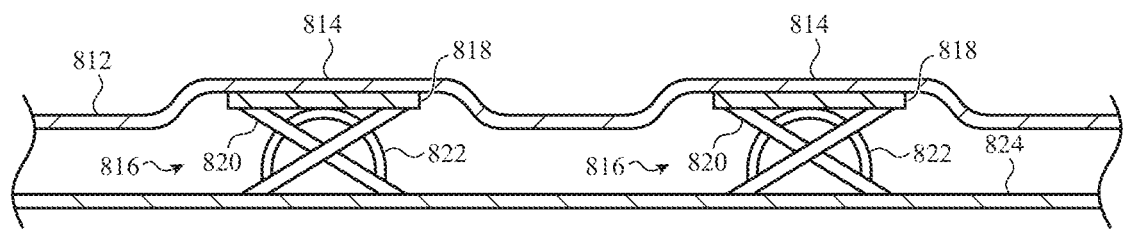

FIG. 8D shows a partial cross-sectional view of an example top case 812 that defines protrusions 814, and in which key mechanisms 816 are positioned below the protrusions. The protrusions 814 in the top case 812 may be configured to buckle or collapse, as described with respect to FIGS. 6A-6C, or deform without buckling or collapsing, as described with respect to FIGS. 4A-4C. The top case 812 may be the same as or similar to other top cases described herein. For example, the top case 812 may be glass having a thickness of about 40 microns or less.

Like the resilient members in FIGS. 8A-8C, the key mechanisms 816 may interact with the protrusions 814 to, for example, impart a returning force on the protrusions 814 to bias the protrusions 814 in an undepressed position and/or to provide tactile feedback (e.g., a "click") when the protrusion 814 is actuated.

The key mechanisms 816 may include an actuation member 818, a substrate 824, a collapsible member 822, and a support mechanism 820 that is configured to support the actuation member 818 and allow the actuation member 818 to move between an undepressed position and a depressed position. The support mechanism 820 may be coupled to the substrate 824 and the actuation member 818, and may have any suitable configuration. As shown, for example, the support mechanism resembles a scissor mechanism, though other types and configurations are also possible, such as butterfly hinges, linear guides, linkages, and the like.

The collapsible member 822 may be any suitable collapsible member, such as a collapsible dome. The collapsible member 822 may be formed from or include conductive materials to allow the collapsible member 822 to act as a switch to detect or register actuations of a key region defined by a protrusion 814. For example, when the collapsible member 822 is collapsed (e.g., by a user pressing on the protrusion 814), the collapsible member 822 may contact electrical contacts or electrodes on the substrate 824, thereby closing a circuit and allowing a computing device to register a key input. Moreover, the collapsible member 822 may provide the biasing force to the actuation member 818 and, by extension, the protrusion 814, and the collapse of the collapsible member 822 when the protrusion 814 is pressed and deformed may provide the tactile "click" to the key region.

The actuation member 818 may contact an underside of a protrusion 814 and may be adhered or otherwise bonded to the top case 812, or it may be not adhered or bonded to the top case 812. In some cases, the actuation member 818 may define a glyph or symbol on a top surface of the actuation member 818, which may be visible through the top case 812. Because the glyph or symbol indicating the function of that particular key region is below the transparent (e.g., glass) top case 812, the glyph or symbol may be protected from wear and abrasion as a result of typing inputs on the key region.

Figure 9A:
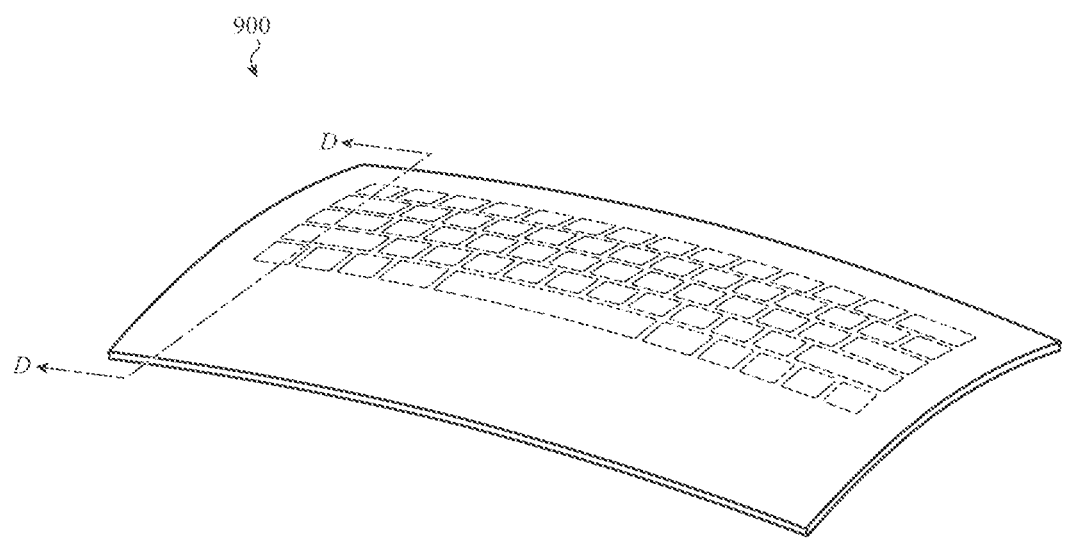
FIG. 9A depicts another example configuration of a glass top case.

While the foregoing discussion describes various aspects of local deformation and local buckling of key regions, a glass top case may also or instead be configured to provide global buckling. For example, FIG. 9A shows a top case 900 having a shape that is configured to provide global buckling. More particularly, substantially the entire top case 900, or at least the portion of the top case 900 corresponding to a keyboard region, may be configured to buckle in response to forces applied to a top surface of the top case 900. The particular shape of the top case 900 in FIG. 9A (e.g., a generally dome-shaped or convex shape) is merely exemplary, and other shapes or configurations may instead be used to produce a globally-buckling top case.

FIGS. 9B-9E show a partial cross-sectional view of a top case 900, corresponding to a view of the top case 900 along section D-D in FIG. 9A. While FIGS. 9B-9E generally agree with the shape of the top case 900 shown in FIG. 9A, it will be understood that this is merely an example shape, and the cross-sectional shape of a top case may differ from that shown depending on the particular shape or configuration used for a globally-buckling top case.

Figure 9B:
FIGS. 9B-9E depict example cross-sectional views of a glass top case that exhibits global buckling.
Figure 9C:
Figure 9D:
Figure 9E:

As shown in FIGS. 9B-9C, when the top case 900 is depressed in one area (e.g., by a user's finger 902, a stylus, or another object), the entire buckling portion of the top case 900 collapses or buckles, thus producing a tactile click response when a particular force threshold is reached. When the user's finger 902 is removed from the top case 900, the buckling portion of the top case 900 returns to a rest (e.g., upwardly protruding) position (as shown in FIG. 9D). When a force is applied on a different area of the top case 900, as shown in FIGS. 9D-9E, the top case 900 may collapse or buckle in substantially the same manner as shown in FIG. 9C. In this way, a user may click or press anywhere on the top case 900 and detect a tactile click. Global buckling as shown and described in FIGS. 9A-9E may provide haptic, tactile feedback to a keyboard region. For example, keys may be struck sequentially while typing (e.g., one after another). Accordingly, it may not be necessary for each key region to produce a buckling response, as the global buckling response may be capable of producing a tactile click for each sequential key strike. Further, a globally buckling top case may be used with a top case having a substantially flat or planar top surface, or a top case having physically distinguished key regions, such as pads, protrusions, recesses, or the like.

Figure 10A:
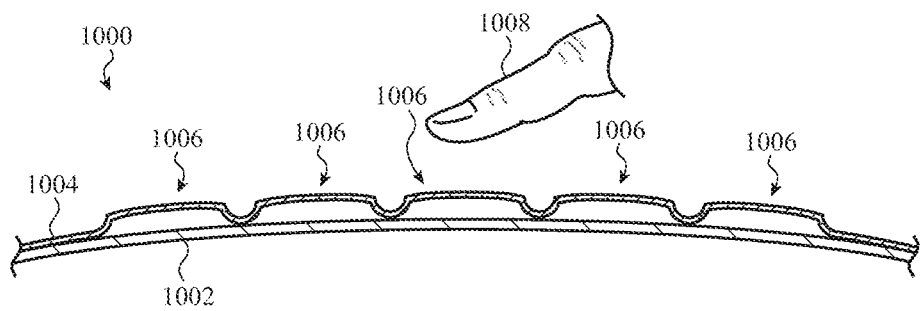
FIGS. 10A-10C depict example cross-sectional views of a dual-layer glass top case.

In some cases, a top case may be configured to produce both local and global buckling responses in response to force inputs. FIGS. 10A-10D relate to a multi-layer glass top case 1000 that produces both local and global buckling responses. With reference to FIG. 10A, which is a partial cross-sectional view of the top case 1000, corresponding to a view of a top case along line B-B in FIG. 1, the top case 1000 may include a first glass layer 1004. The first glass layer 1004 may define an array of protrusions 1006 that define key regions of a keyboard. The first glass layer 1004 may be substantially similar in materials, dimensions, and function to the top case 700 described with respect to FIGS. 7A-7B. For example, the first glass layer 1004 may be formed from a strengthened glass having a thickness less than about 40 μm, and each protrusion 1006 may be configured to buckle or collapse in response to application of a force to produce a first tactile click.

The top case 1000 may also include a second glass layer 1002. The second glass layer 1002 may be substantially similar to the top case 900 (FIGS. 9A-9E), and may be formed of the same materials and provide the same functions. For example, the second glass layer 1002 may be formed from strengthened glass and may have a shape that provides a buckling response when forces are applied to different areas on the second glass layer 1002. The first glass layer 1004 may be above the second glass layer 1002, and may be attached to the second glass layer 1002. For example, the first glass layer 1004 may be bonded, adhered, fused, or otherwise attached to the second glass layer 1002. The spaces under the protrusions 1006 may be empty or they may be occupied by a material. For example, the spaces under the protrusions 1006 may be under vacuum, or filled with air, a liquid, a resilient material (e.g., a gel, silicone, etc.), or any other suitable material.

Figure 10B:
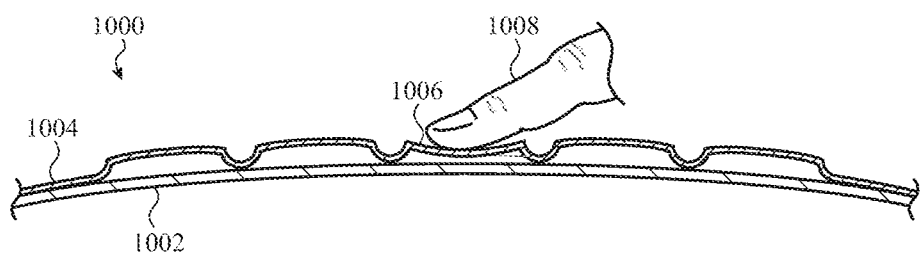
Figure 10C:
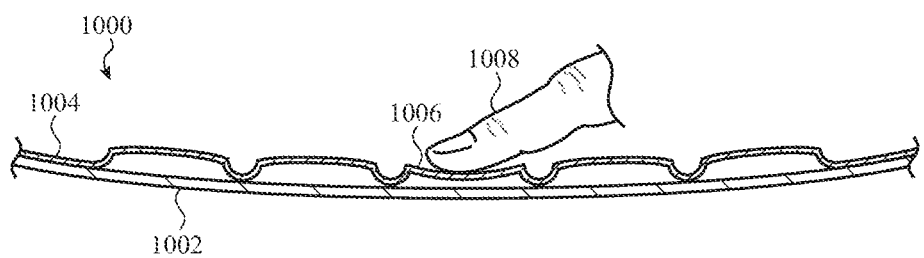
Figure 10D:
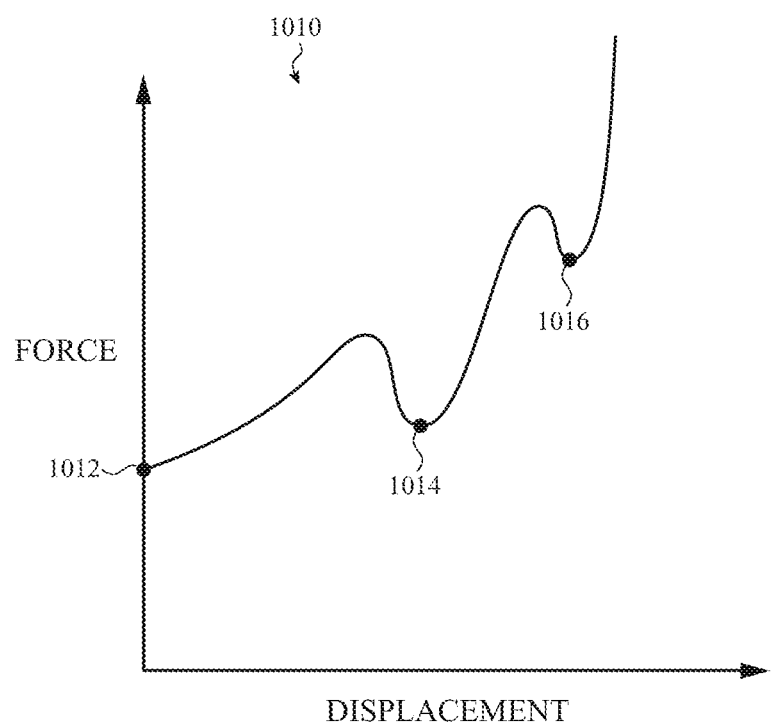
FIG. 10D depicts an example force versus deflection curve of a key region of the glass top case of FIGS. 10A-10C.

FIGS. 10B and 10C show how the two glass layers of the top case 1000 may deflect in response to application of a force input (from a user's finger 1008, for example), and FIG. 10D shows an example force versus deflection curve 1010 for the dual-layer top case 1000. In particular, the top case 1000 may produce buckling responses at two different force levels, each corresponding to a buckling of a different one of the layers. FIG. 10B shows a finger 1008 deforming a protrusion 1006 of the first glass layer 1004, which may correspond to a path in the force versus deflection curve 1010 from the point 1012 to the point 1014. This force response may correspond to a typical typing input, and may produce a tactile click indicating that the key region has been actuated and the input has been detected. If the user continues to increase the force after the protrusion 1006 is deformed (e.g., past the point 1014 in the curve 1010), the second glass layer 1002 may ultimately buckle or collapse, as shown in FIG. 10C. This additional force may correspond to the path from point 1014 to point 1016 on the curve 1010. When the second glass layer 1002 buckles, the keyboard may register a different input, and thus perform a different action, than when the first glass layer 1004 buckles. For example, when a buckling of a protrusion or key region of the first glass layer 1004 is detected (e.g., at or around point 1014), the keyboard may register a selection of a character key and cause a lower case character to be displayed on a display. When a buckling of the second glass layer 1002 is detected (e.g., at or around point 1016), the keyboard may replace the lower case character with an upper case character. Other functions may also or instead be associated with each of the first and second buckling points.

Figure 11A:
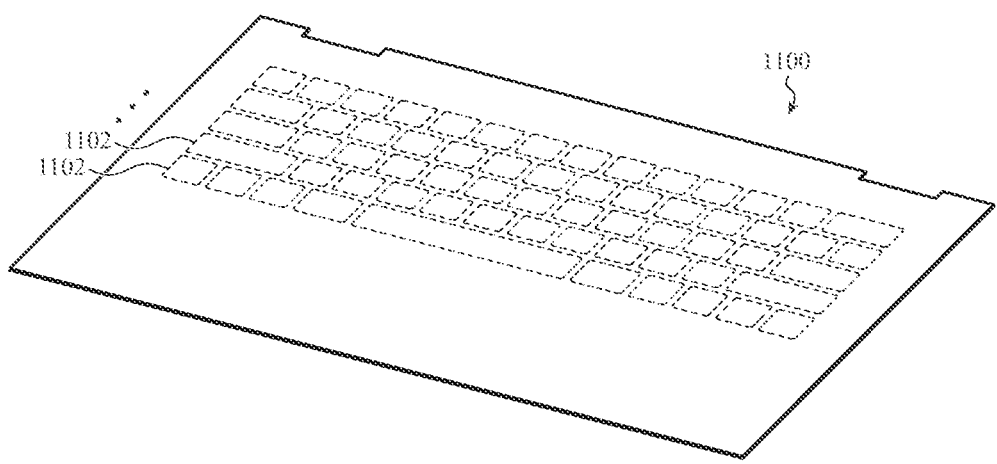
FIGS. 11A-11B depict an example glass top case with retractable key protrusions.
Figure 11B:
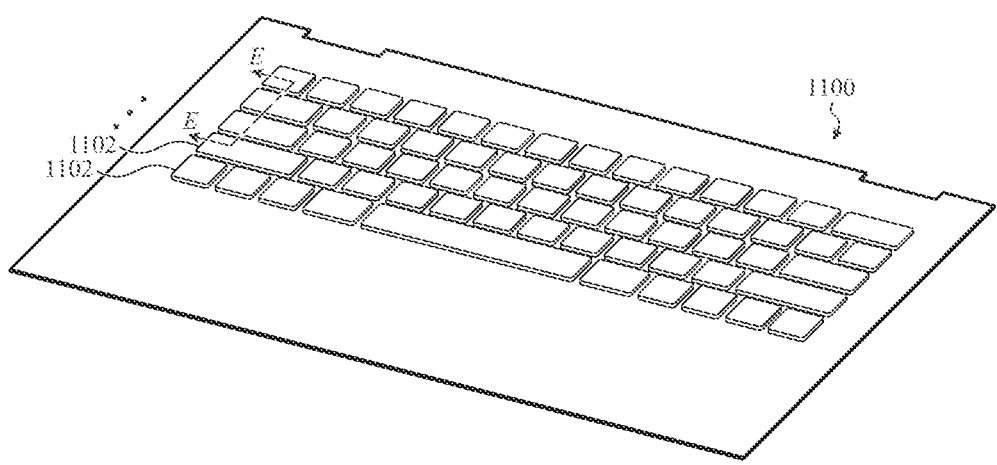

As described herein, a glass top case may be made sufficiently thin that force inputs from user's fingers, such as typing inputs, can locally deform the glass. This can be used to provide "moving" key regions that are easier and more intuitive to type on, and even to produce tactile clicks and other haptic feedback. In some cases, the flexibility and/or deformability of a thin glass top case may be used in conjunction with actuators to selectively form protrusions or recesses to define key regions. For example, FIGS. 11A-11B show a top case 1100, which may be formed of a thin glass having dimensions and compositions as described herein, with an array of key regions 1102 defined by selectively formed protrusions. In particular, FIG. 11A shows the top case 1100 having key regions 1102 that are substantially flush with the remaining portion of the top case 1100. FIG. 11B shows the top case 1100 when actuators below or otherwise associated with the key regions 1102 are extended, thus producing protruding key regions 1102 on the top case 1100.

The key regions 1102 may be retracted (FIG. 11A) or extended (FIG. 11B) for various reasons. For example, if the top case 1100 is incorporated into a laptop computer (e.g., the device 100, FIG. 1), the key regions 1102 may be extended when the computer is opened (e.g., the display portion 102 is rotated up into a viewable position) to allow a user to apply typing inputs. As another example, the key regions 1102 may be extended when the device 100 is in a text entry mode, such as when a word processor or other application that accepts text input is active on the device 100. On the other hand, the key regions 1102 may be retracted when the device is closed or closing, which allows the closed device to occupy less space. Thus, because the key regions 1102 can be selectively extended and retracted, they can be extended when the keyboard is in use or potentially in use, thereby providing a superior typing experience, and can be retracted when the keyboard is not in use so that the keyboard assembly occupies less space and the overall size of the device 100 is reduced.

While FIGS. 11A-11B show all of the key regions 1102 either retracted or extended, the key regions 1102 may be individually controlled so that one or more key regions may be retracted while one or more other key regions are extended (or vice versa). Moreover, as shown, the top case 1100 in FIG. 11A has a substantially planar top surface, though this is merely one example. In other cases, when the key regions 1102 are retracted, they protrude less than when the key regions 1102 are extended but are not flush with surrounding areas of the top case 1100.

The top case 1100 may be substantially planar when there are no forces acting on the top case (e.g., from internal actuators), or the top case may define raised key regions when there are no forces acting on the top case. That is, the neutral state of the top case 1100 may be substantially planar, and the raised key regions may be formed by deforming the top case 1100 with the actuators. In other cases, the neutral state of the top case 1100 may include raised key regions, and the top case 1100 may be made substantially planar (or the protrusions may be lessened in size) by applying retracting forces with the actuators.

Figure 12A:
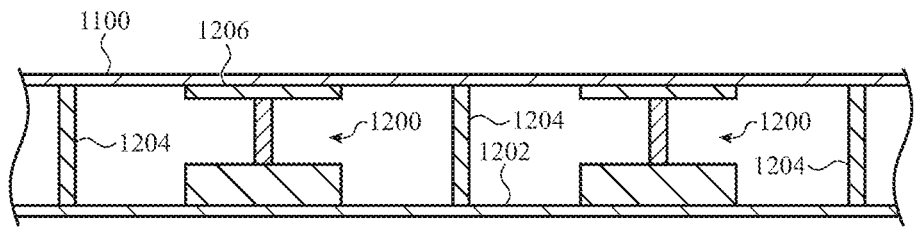
FIGS. 12A-14B depict example cross-sectional views of devices having actuators to produce retractable key protrusions.
Figure 12B:
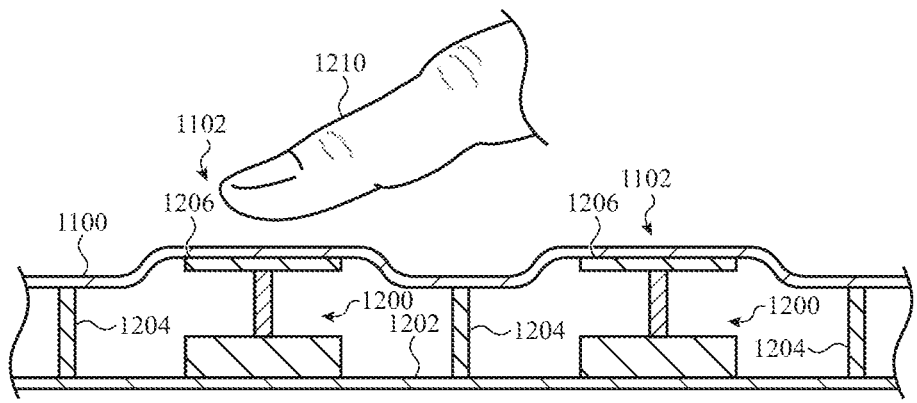

Various types of actuators or other mechanisms may be used to extend and/or retract key regions of a glass top case. For example, FIGS. 12A-12B are partial cross-sectional views of an electronic device, viewed along line E-E in FIG. 11B, showing example mechanical actuators 1200 that may be positioned under the top case 1100. The mechanical actuators 1200 may include plungers 1206 that engage a bottom surface of the top case 1100 to locally deform the key regions 1102 when the actuators 1200 are extended. The actuators 1200 may be any suitable type of actuators, including solenoids, hydraulic actuators, pneumatic actuators, lead screws, cams, etc. In some cases, the plungers 1206 may be bonded, adhered, or otherwise fixed to the bottom surface of the top case 1100, which may allow the actuators 1200 to further retract the key regions 1102 to form cavities relative to the remaining portions of the top case 1100.

The actuators 1200 may be supported by a base 1202, which may be part of a housing (e.g., bottom case 110, FIG. 1), or any other component or structure of an electronic device. Furthermore, the top case 1100 may be supported by support structures 1204 that brace or otherwise support the top case 1100 relative to another part of the device in which it is integrated, such as the base 1202. The support structures 1204 may be adhered to or bonded to the top case 1100 to isolate and/or localize deformations produced by the actuators 1200, thereby allowing the actuators 1200 to produce discrete protrusions for the different key regions 1102, rather than simply lifting the entire top case 1100.

Figure 12C:
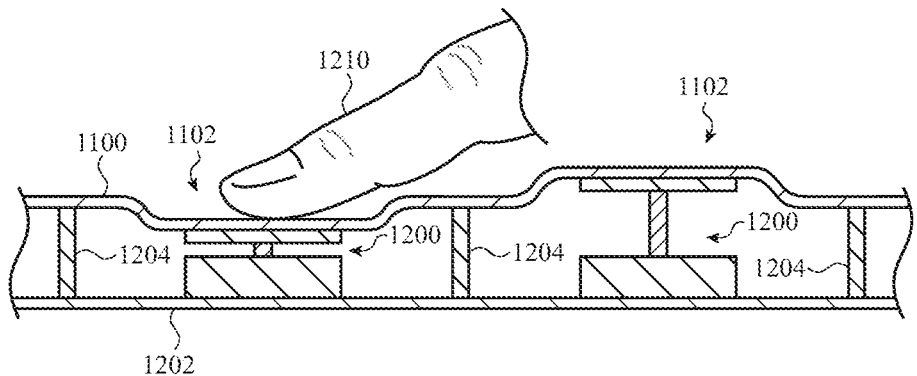

Despite the presence of the actuators, the key regions 1102 of the top case 1100 may locally deflect in response to applied forces. For example, FIG. 12C shows a key region 1102 of the top case 1100 deflecting in response to a force applied by a finger 1210. While FIG. 12C shows the key region 1102 deflecting to form a recess, this is merely one example configuration. In other cases, the key region 1102 may deflect from a protruding configuration (as shown in FIG. 12B) to a substantially planar configuration (e.g., as shown in FIG. 12A), or to a protruding configuration that is lower than that shown in FIG. 12B.

The actuators 1200 may be configured to remove or reduce the force applied to the top case 1100 (or produce a reverse force tending to retract the key region 1102) when a force is detected on the key region 1102. In some cases, the actuators 1200 may be used to impart a returning force to the key region 1102, such as to provide a desired tactile feel to the key regions 1102 and/or to return a collapsing or buckling key region into its undeflected or undeformed position. In some cases, the actuators 1200 may be haptic actuators that produce haptic outputs. For example, the actuators 1200 may produce a force response that is substantially similar to the force versus deflection curves discussed with respect to FIG. 6C or 10D, producing a tactile click that may be felt and/or heard by a user. In some cases, the actuators 1200 produce a motion or vibration that is perceptible by the user and provides the tactile response (e.g., "click"). Such haptic outputs may be used in conjunction with both buckling and non-buckling style top cases.

Figure 13A:
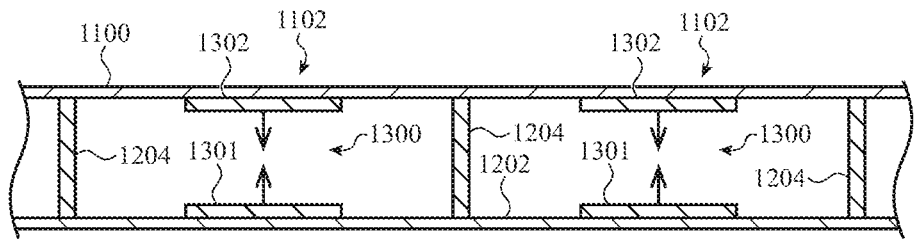
Figure 13B:
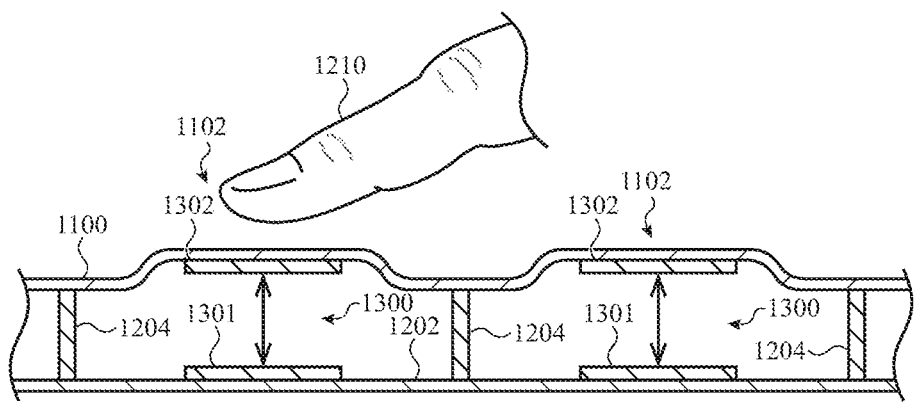
Figure 13C:
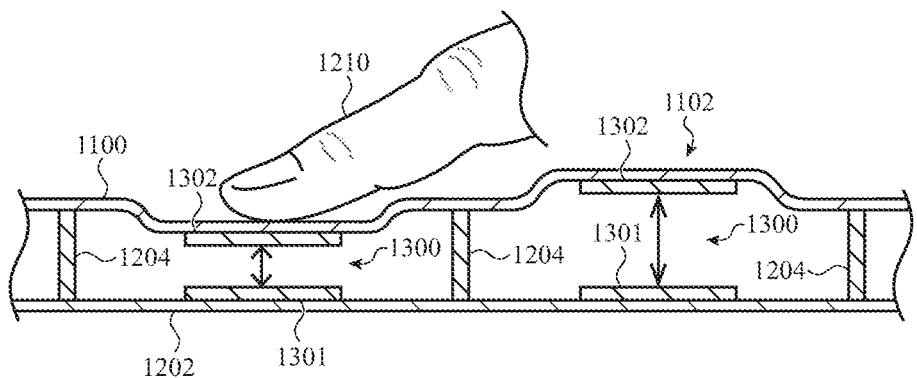

Magnetic actuators may be used instead of or in addition to mechanical actuators. For example, FIGS. 13A-13C are partial cross-sectional views of an electronic device, viewed along line E-E in FIG. 11B, showing example magnetic actuators 1300 that may be positioned under the top case 1100 to extend and/or retract the key regions 1102. FIG. 13A shows the top case 1100 when the key regions 1102 are retracted, and FIG. 13B shows the top case 1100 with the key regions 1102 extended. FIG. 13C shows the top case 1100 when a key region 1102 is locally deflected in response to a force applied by a finger 1210.

The magnetic actuators 1300 may each include a first magnetic element 1301 and a second magnetic element 1302. The first and second magnetic elements 1301, 1302 may be any of magnets (e.g., permanent magnets, rare earth magnets, electromagnets, etc.) magnetic materials, magnetizable materials, ferromagnetic materials, metals, or the like. The first and second magnetic elements 1301, 1302 may be selectively powered or magnetized to produce repulsive forces (as shown in FIG. 13B) or attractive forces (as shown in FIG. 13A). In some cases, magnets or magnetic materials may be selectively magnetized and demagnetized to produce repulsive or attractive forces (or no forces) by subjecting a magnetic material to a particular magnetic field. This may allow the magnetic elements 1301, 1302 to produce continuous forces without requiring constant application of energy or electricity to an electromagnet. In some cases, the magnetic actuators 1300 may include shields, shunts, inducing coils, and/or other components to facilitate selective magnetization and demagnetization, or to otherwise operate the magnetic actuators 1300.

The magnetic actuators 1300 may provide the same or similar functions to the mechanical actuators described above. For example, the magnetic actuators 1300 may be configured to impart a returning force to a top case with buckling or non-buckling protrusions. As another example, the magnetic actuators 1300 may be configured to produce tactile clicks that may be felt and/or heard by a user. As noted above, such actuator-produced haptic outputs may be used in conjunction with both buckling and non-buckling style top cases.

Figure 14A:
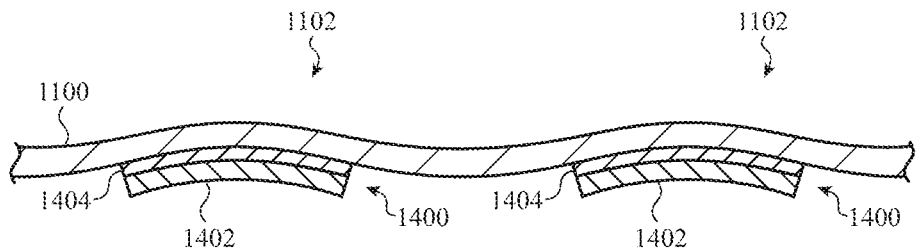
Figure 14B:
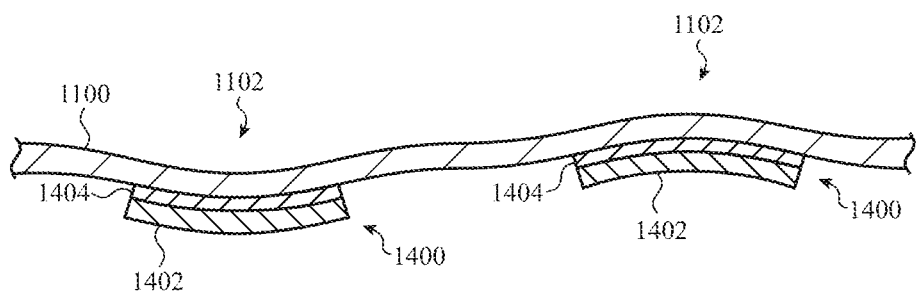

Piezoelectric actuators may also be used to selectively extend and retract protruding key regions. For example, FIGS. 14A-14B are partial cross-sectional views of an electronic device, viewed along line E-E in FIG. 11B, showing example piezoelectric actuators 1400 that may be positioned under the top case 1100 to locally deform the top case 1100 to extend and/or retract the key regions 1102. FIG. 14A shows the top case 1100 when the key regions 1102 are extended, and FIG. 14B shows the top case 1100 with a key region 1102 retracted. FIG. 14B shows the key region 1102 retracted to form a cavity in the top surface of the top case 1100, though this is merely one example configuration, and the piezoelectric actuators 1400 may instead retract the key regions 1102 to a substantially flush configuration.

The piezoelectric actuators may include actuator strips 1402, which may be formed from a piezoelectric material. Force-spreading layers 1404 may be disposed between the actuator strips 1402 and the bottom surface of the top case 1100 (and directly under or proximate the key regions 1102). The force-spreading layers 1404 may increase the area of influence of the actuator strips 1402. More particularly, the force-spreading layers 1404 may increase the area of the top case 1100 that may be deformed by the actuator strips 1402. The force-spreading layers 1404 may be formed from or include any suitable material, such as silicone, metal, glass, elastomeric materials, polymers, or the like.

As depicted in FIG. 14A, a voltage may be applied across the piezoelectric material of an actuator strip 1402 causing the actuator strip 1402 to shrink or reduce in length. If the actuator strip 1402 is not allowed to shear with respect to the top case 1100, the change in length may produce a raised or protruding key region 1102. The localized deformation may also be characterized as convex or proud of the top case 1100.

As depicted in FIG. 14B, a voltage may be applied across the piezoelectric material of the actuator strip 1402 causing the actuator strip 1402 to grow or increase in length. Similar to the previous example, if the actuator strip 1402 is not allowed to shear with respect to the top case 1100, the change in length may produce a depressed or recessed key region 1102. The localized deformation may also be characterized as concave or recessed.

The top case 1100 in FIGS. 14A-14B may have the protrusions formed therein, and the protrusions may be configured as buckling or collapsing protrusions that produce a tactile click, as described with respect to FIGS. 6A-6C. In such cases, and similar to the mechanical and magnetic actuators described above, the piezoelectric actuators 1400 may be configured to impart a returning force to the protrusions so that they return to a neutral, undeformed position after buckling or collapsing in response to a force input.

When actuators are used to selectively locally deform a top case, support structures may be positioned below the top case or otherwise configured to localize and isolate the deformations produced by the actuators. Example supports are shown and described with respect to FIGS. 12A-13C. In some cases, however, multiple actuators may cooperate to produce local deformations, such as deformations of only a single key region, without support structures that surround or isolate deformations of particular key regions.

Figure 15A:
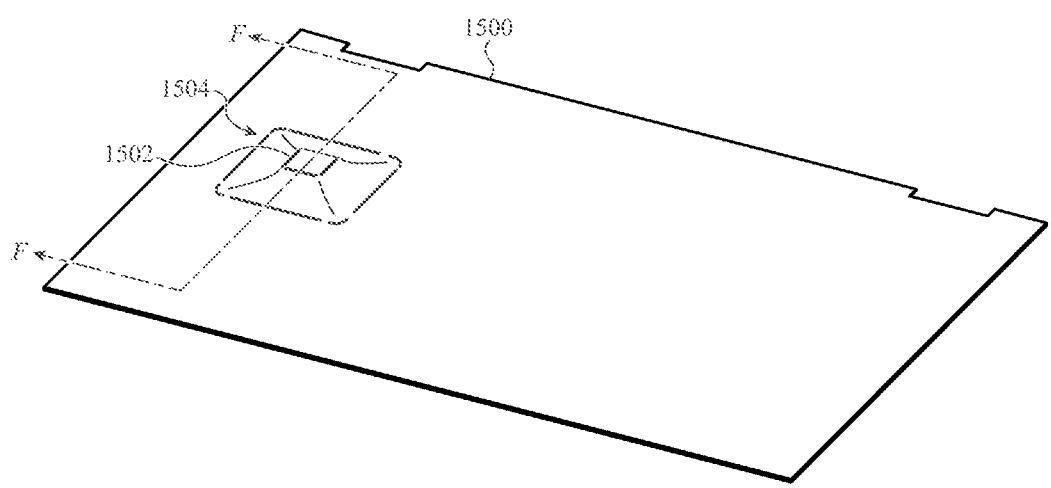
FIGS. 15A-15B depict a glass top case with actuators that selectively form protruding key regions.
Figure 15B:
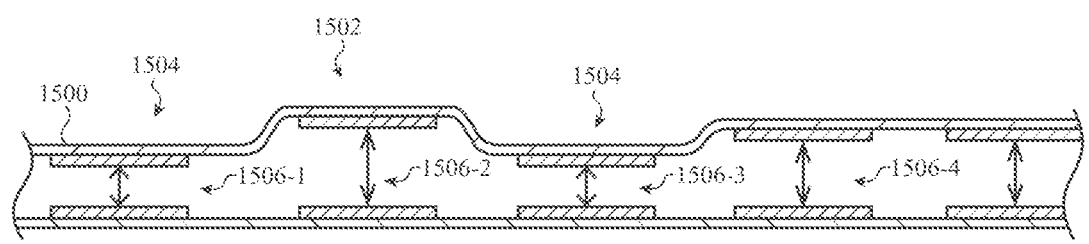

FIGS. 15A-15B show an example of how actuators may cooperate to produce localized deformations in a top case 1500 without support structures that isolate the effect of each actuator. For example, FIG. 15A shows the top case 1500 (which may be a glass top case having the dimensions and/or properties of any of the top cases described herein) with a key region 1502 protruding from a surrounding area 1504. FIG. 15B shows a partial cross-sectional view of a device having the top case 1500, viewed along line F-F in FIG. 15A. Actuators 1506-1, . . . , 1506-*n* positioned below the top case 1500 act on the top case 1500 to impart forces on the top case 1500 to produce deformations. For example, to produce the protruding key region 1502, without using supports that extend around or define the key region 1502, the actuator 1506-3 may extend, forcing the key region 1502 upwards. Without support structures, extended actuator 1506-3 may cause a protrusion larger than a single key region. Accordingly, actuators in a surrounding or nearby area 1504, including actuators 1506-2 and 1506-4, for example, may retract, thus imparting a counteracting force to the top case 1500 that will help produce a more distinctive, localized protrusion for the key region 1502.

The surrounding region 1504 is shown as being retracted relative to a remainder of the top case 1500. However, this is merely for illustration, and the surrounding actuators may instead produce counteracting forces that maintain the surrounding region 1504 substantially unmoved relative to an undeformed height or position of the top case 1500. Also, while the actuators 1506 are shown as magnetic actuators, other types of actuators may be used in a similar manner to help localize deformations from other actuators, including, for example, mechanical actuators, piezoelectric actuators, or the like.

Cooperating actuators as described above may not be sufficient to allow all of the key regions to be retracted or extended at the same time. Accordingly, these techniques may be implemented in devices where an entire keyboard of protrusions does not need to be produced simultaneously. For example, in some cases, a keyboard may produce local deformations for individual key regions only when that key region is being pressed or is about to be pressed (as determined, for example, by optical sensors, touch sensors, presence sensors, or the like). Thus, the actuators 1506, for example, may cooperate to cause the key region 1502 to protrude immediately before and/or while that key is being pressed, and then may cooperate to cause another key region to protrude before and/or while the other key region is being pressed.

While the actuators described herein are primarily described as producing localized deformations in a glass top case, these (or other) actuators may also be used to produce other haptic outputs. For example, actuators may produce movement, vibrations, pulses, oscillations, or any other motion or tactile output that can be felt by a user through the top case. Such haptic outputs may be used, for example, to indicate when an input has been registered, or to simulate the sensation of a tactile "click" of a buckling dome or spring. In the latter case, such haptic actuators may be used in conjunction with top cases that do not have buckling or collapsing shapes to provide a familiar tactile feel to the key regions of the top case.

Figure 16A:
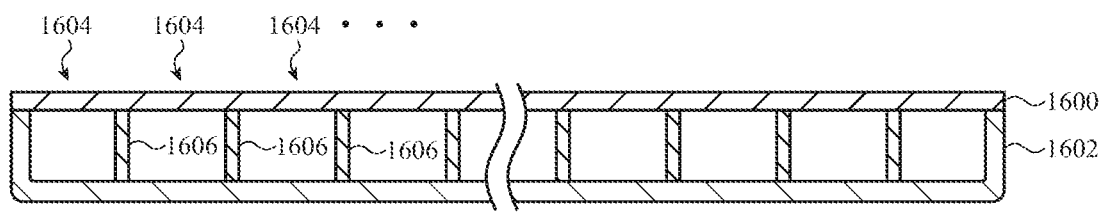
FIGS. 16A-16B depict example cross-sectional views of devices having support structures.
Figure 16B:
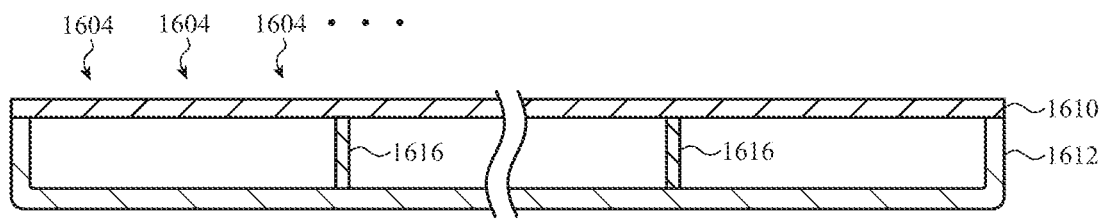

As described above, support structures may be incorporated into an electronic device to support a top case and to optionally help localize deflections of the top case to individual key regions or subsets of the key regions. FIGS. 16A-16B are partial cross-sectional views of an electronic device, and in particular a base portion of an electronic device, corresponding to a view of a top case along section B-B in FIG. 1. These figures show examples of top cases supported by support structures. For example, FIG. 16A shows a top case 1600, such as a glass top case, attached to a bottom case 1602. The bottom case 1602 may correspond to the bottom case 110, FIG. 1. The top case 1600 may define an array of key regions 1604. As shown in FIG. 16A, top case 1600 defines substantially planar top and bottom surfaces. However, the key regions 1604 may correspond to any of the key regions described herein, including raised or protruding key regions, recessed key regions, collapsing or buckling key regions, key regions defined by channels or features on the bottom surface of the top case, or the like.

The electronic device shown in FIG. 16A includes support structures 1606 inside the base portion. The support structures 1606 are positioned to support regions of the top case 1600 between adjacent key regions 1604 (e.g., in non-key regions of the top case 1600). As shown, each key region 1604 may be isolated from other key regions by a support structure 1606, thus isolating and/or localizing deflections to individual key regions caused by user inputs applied to the key regions. In some cases, the support structures 1606 may define closed regions that fully extend around or define an outer perimeter of a key region 1604. For example, the support structures 1606 may resemble a keyboard web with openings defining individual key regions. The openings may have any shape or configuration, such as square, circular, oblong, rectangular, or any other suitable shape.

As noted, FIG. 16A shows an example in which the support structures are positioned between each key region. FIG. 16B shows a configuration of an electronic device in which there is not a support structure between each key region, but rather multiple key regions between support structures. In particular, FIG. 16B shows a base portion with a top case 1610 (e.g., a glass top case) attached to a bottom case 1612. The top case 1610 defines key regions 1604 (which may have any shape described herein, as noted above with respect to the top case 1600). Support structures 1616 contact the underside of the top case 1610 to support the top case, localize deflection, and the like.

The support structures 1606, 1616 are shown extending from the top cases 1600, 1610 to the bottom cases 1602, 1612. However, this is merely an example configuration. In other configurations, at least some of the support structures 1606, 1616 do not directly contact the bottom case, but instead contact a different internal component or structure of an electronic device. In yet other configurations, the bottom cases 1602, 1612 and the support structures 1606, 1616 are a unitary structure (e.g., they form a monolithic component). For example, the bottom cases may be formed (e.g., machined or cast) with posts or walls extending upwards from the surfaces of the bottom cases. In yet other configurations, the support structures 1606, 1616 are part of a web, such as a sheet having an array of openings therein. The openings may correspond to or substantially define single key regions or multiple key regions. Where the support structures 1606, 1616 are defined by a web, the web may be adhered to a bottom surface of the top cases 1600, 1610.

Using a glass member for a top case, and more particularly for the input surface of a keyboard, may also provide unique opportunities for forming wear-resistant glyphs (or other symbols) on the individual key regions. FIGS. 17A-17D illustrate various techniques for forming glyphs on a continuous glass (or other transparent material) top case.

Figure 17A:
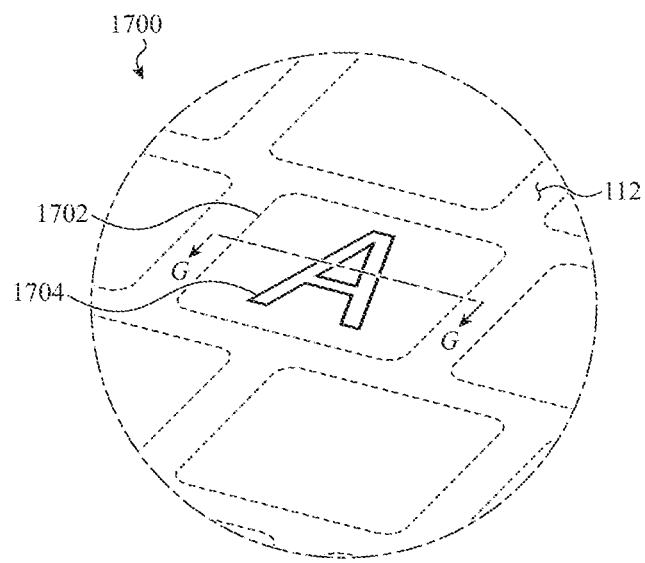
FIG. 17A depicts a detail view of the computing device of FIG. 1.

FIG. 17A is a detail view of region C-C of the top case 112 of the computing device 100 (FIG. 1), showing an example key region 1702. The key region 1702 may correspond to one of the key regions 115 of the keyboard region 114. The key region 1702 may include a glyph 1704, which may indicate the function of the key region 1702. As described herein, the glyph 1704 may be defined on a bottom surface of the top case 112, such that the top surface of the top case 112 that a user touches when typing is simply a plain glass surface.

Figure 17B:
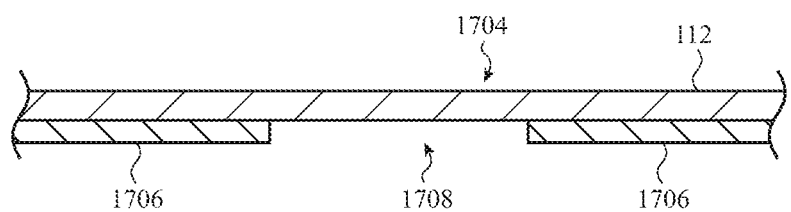
FIGS. 17B-17D depict example cross-sectional views of the glass top case of FIG. 17A.
Figure 17C:
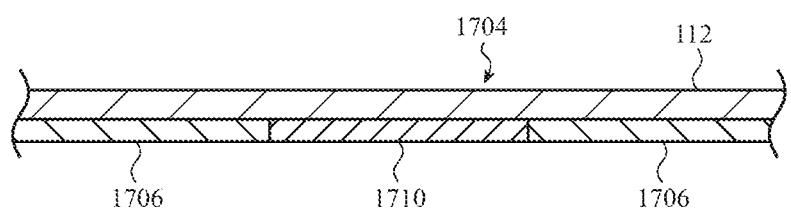
Figure 17D:
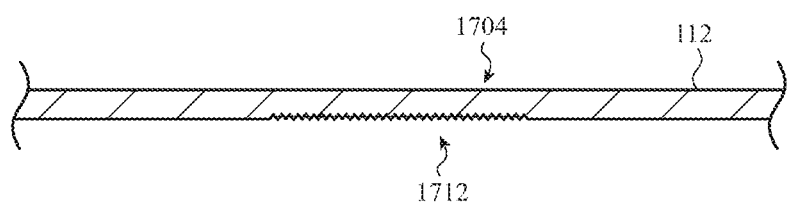

FIGS. 17B-17D are partial cross-sectional views of the top case 112, viewed along line G-G in FIG. 17A, showing various example techniques for forming glyphs on the bottom surface of the top case 112. FIG. 17B, for example, shows a mask layer 1706 disposed on the bottom surface of the top case 112. The mask layer 1706 may include openings, such as the opening 1708 in FIG. 17B, that define the glyphs. The mask layer 1706 may have a contrasting visual appearance to the opening 1708 (or to whatever is visible through the opening 1708) to allow the glyph 1704 to be visually distinguished from the surrounding area of the key region 1702. The mask layer 1706 may be any suitable material, such as paint, dye, ink, a film layer, or the like, and may be any suitable color. The mask layer 1706 may also be opaque to occlude underlying components, materials, structures, adhesives, or other internal components of the device 100. In some cases, another layer or material is positioned below the opening 1708 so that the underlying layer or material is visible through the top case 112.

FIG. 17C shows an example in which the opening in the mask layer 1706 has an additional layer 1710 positioned therein. The additional layer 1710 may have a visual appearance that contrasts that of the mask layer 1706 to define the glyph. The additional layer 1710 may be any suitable material, such as paint, dye, ink, a film layer, or the like, and may be opaque or translucent. In some cases, the additional layer 1710 may be a semi-transparent mirror material (e.g., a metal film) that can be reflective under some external lighting conditions and transparent (or at least partially transparent or translucent) under other external lighting conditions. For example, if a light source below the additional layer 1710 is active, the additional layer 1710 may appear to a user to be backlit (e.g., the glyph 1704 may appear illuminated).

FIG. 17D shows an example in which the bottom surface of the top case 112 has a contrasting surface finish or other treatment 1712 in the mask layer 1706 to define the glyph 1704. For example, the portion of the bottom surface of the top case 112 that corresponds to a glyph opening may have a different roughness, texture, or other physical characteristic, than the surrounding non-glyph areas. The surface finish or treatment may be produced in any suitable way, such as etching (e.g., chemical etching, laser etching, plasma etching), machining, grinding, abrasive blasting, or the like. When viewed through the top surface of the top case 112, the different surface finish or treatment 1712 may have a distinct visual appearance than the surrounding areas. In some cases, additional layers may be used in conjunction with the top case 112 shown in FIG. 17D. For example, a mask layer 1706 (as shown in FIGS. 17B-17C) may be applied to the non-glyph regions of the top case 112 (as discussed above), and an additional layer 1710 may be applied on the surface finish or treatment 1712.

While the foregoing examples show the glyphs defined by material on the bottom surface of the top case 112, these are merely some example techniques for forming the glyphs. In some cases, glyphs may be defined on the top surface of the top case 112 using the same or similar configurations as those shown in FIGS. 17B-17D (e.g., the mask layers, additional layers, and surface treatments may be applied to the top surface). In some cases, both the top and bottom surfaces of the top case 112 may include coatings, inks, dyes, paints, surface treatments, or the like, to define the glyphs (or any other graphical objects desired to be visible on the top case 112).

Glass members for keyboard surfaces may be coupled to an electronic device in various ways. For example, as shown in FIG. 1, a glass top case 112 may define substantially all of a top surface of a computing device, and may be coupled directly to a bottom case 110. FIGS. 18A-18D illustrate other example techniques for coupling a glass member for a keyboard surface to a computing device.

Figure 18A:
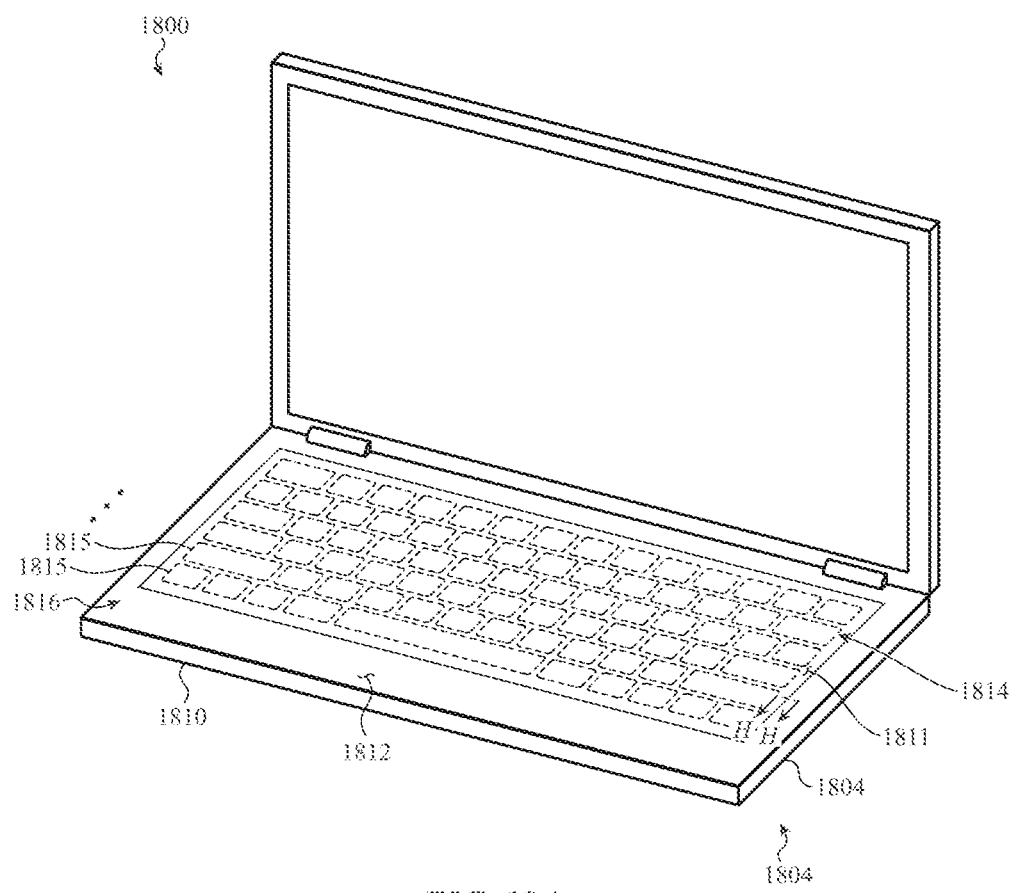
FIG. 18A depicts a simplified example of a computing device.

FIG. 18A depicts a computing device 1800 (or simply "device 1800") that may include a glass member defining a keyboard surface. In particular, a base portion 1804 of the device 1800 may include a top case 1812 and a separate keyboard member 1811 that is formed at least partially from glass and that defines a keyboard region 1814 of the device 1800. The device 1800 may otherwise be the same as or similar to the device 100 described above, and aspects of the device 100 that are discussed herein will be understood to apply equally to the device 1800.

The keyboard member 1811 may have any of the properties and/or employ any of the features described herein with respect to other top cases, including deformable protrusions, buckling configurations, underlying resilient members, and the like. For example, the keyboard member 1811 may be formed from one or more layers of strengthened glass (e.g., chemically strengthened, ion-exchanged, heat-treated, tempered, annealed, or the like). The glass may be thinner than about 100 µm, thinner than about 40 µm, or thinner than about 30 µm. The keyboard member 1811 may be configured to locally deflect or deform any suitable amount in response to a typing force. For example, the keyboard member 1811 may be configured to locally deflect about 0.1 mm, about 0.2 mm, about 0.3 mm, about 0.4 mm, about 0.5 mm, or any other suitable amount, in response to a sample typing force (e.g., 250 g, 500 g, 1 kg, etc.).

The top case 1812 may be formed from or include any suitable material, such as glass, plastic, metal (e.g., aluminum, stainless steel, magnesium, an alloy, etc.). The top case 1812 may also define an opening in which the keyboard member 1811 may be positioned. The top case 1812 may also define or include input regions such as a touch-input region 1816. While both the keyboard member 1811 and the top case 1812 may be formed from glass, they may be formed from different glass materials or have other different properties or characteristics. For example, the top case 1812 may be thicker than the keyboard member 1811 to provide for additional strength and/or stiffness. As another example, the top case 1812 may be formed from a glass having a higher stiffness than the glass of the keyboard member 1811. In this way, the various glass components may be tailored for the particular design targets for each component. More particularly, the thicker top case 1812 may provide greater structural stability, but would not provide sufficient local deflection to provide a good typing experience. Accordingly, the thinner keyboard member 1811 may provide the deformability that provides a desired typing experience, while the thicker top case 1812 provides a desired structural strength and/or stiffness.

Figure 18B:
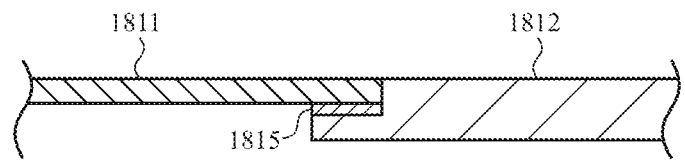
FIGS. 18B-18D depict example cross-sectional views of the computing device of FIG. 18A.
Figure 18C:
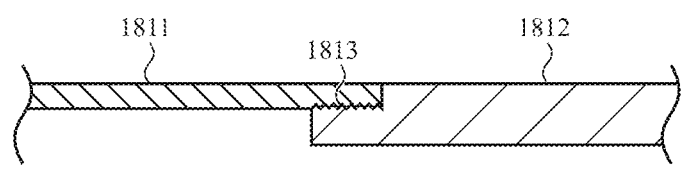
Figure 18D:
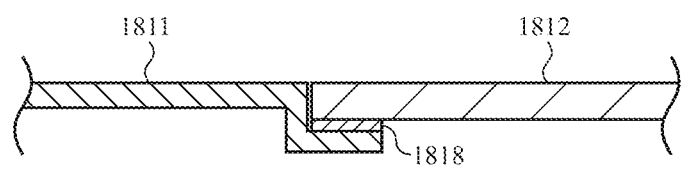

FIGS. 18B-18D are partial cross-sectional views of the device 1800, viewed along line H-H in FIG. 18A, showing example techniques for joining the keyboard member 1811 to the top case 1812. In FIG. 18B, for example, the top case 1812 defines a ledge that supports a peripheral portion of the keyboard member 1811. An adhesive 1815 may be positioned on the ledge to secure the keyboard member 1811 to the top case 1812. The adhesive 1815 may be any suitable adhesive or bonding agent, including pressure sensitive adhesive (PSA), heat sensitive adhesive (HSA), epoxy, contact cement, or the like. As shown in FIGS. 18B-18D, a top surface of the top case 1812 and a top surface of the keyboard member 1811 may be substantially flush (e.g., coplanar), thereby producing a substantially flat top surface to the base portion 1804 of the device 1800.

FIG. 18C shows an example in which the keyboard member 1811 is fused to the top case 1812 along a fused region 1813. The keyboard member 1811 may be fused to the top case 1812 by at least partially melting or softening the top case 1812 and the keyboard member 1811 to form the fused region 1813. The fusion may be achieved using any suitable process, including laser welding, ultrasonic welding, direct heat and/or flame application, pressure, or the like.

FIG. 18D shows an example in which the keyboard member 1811 defines a ledge that is adhered or otherwise bonded to the bottom surface of the top case 1812. The keyboard member 1811 may be bonded to the top case 1812 with an adhesive 1818, which may be any suitable adhesive or bonding agent, including pressure sensitive adhesive (PSA), heat sensitive adhesive (HSA), epoxy, contact cement, or the like.

Figure 19:
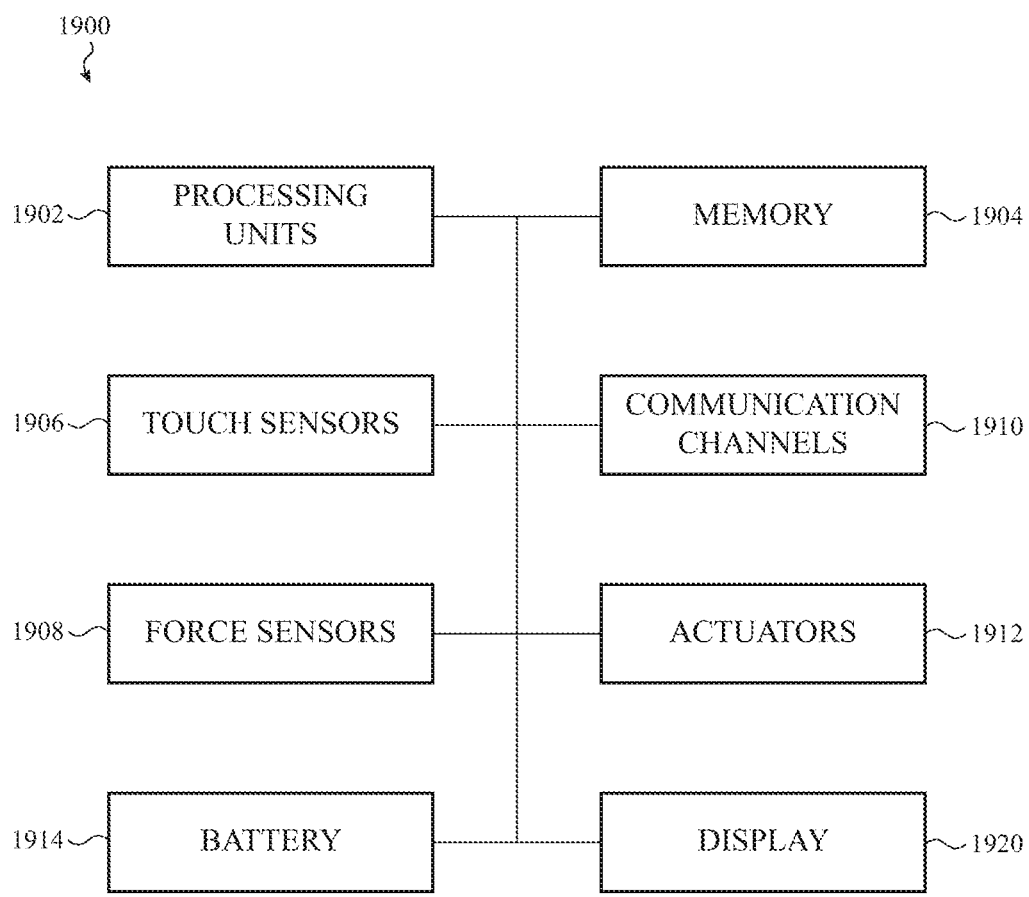
FIG. 19 depicts a schematic diagram of an electronic device.

FIG. 19 depicts an example schematic diagram of an electronic device 1900. By way of example, device 1900 of FIG. 19 may correspond to the computing device 100 shown in FIG. 1 and/or the computing device 1800 shown in FIG. 18A. To the extent that multiple functionalities, operations, and structures are disclosed as being part of, incorporated into, or performed by the device 1900, it should be understood that various embodiments may omit any or all such described functionalities, operations, and structures. Thus, different embodiments of the device 1900 may have some, none, or all of the various capabilities, apparatuses, physical features, modes, and operating parameters discussed herein. The electronic device 1900 may include a thin glass top case, as described herein, on which distinct key regions may be formed. For example, key regions of a keyboard may be defined by protrusions formed into the glass top case, as described herein.

As shown in FIG. 19, the device 1900 includes one or more processing units 1902 that are configured to access a memory 1904 having instructions stored thereon. The instructions or computer programs may be configured to perform one or more of the operations or functions described with respect to the device 1900 (and/or any device described herein, such as the devices 100, 1800). For example, the instructions may be configured to control or coordinate the operation of one or more displays 1920, one or more touch sensors 1906, one or more force sensors 1908, one or more communication channels 1910, and/or one or more actuators 1912.

The processing units 1902 of FIG. 19 may be implemented as any electronic device capable of processing, receiving, or transmitting data or instructions. For example, the processing units 1902 may include one or more of a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 1904 can store electronic data that can be used by the device 1900. For example, a memory can store electrical data or content such as, for example, audio and video files, documents and applications, device settings and user preferences, timing and control signals or data for the various modules, data structures or databases, and so on. The memory 1904 can be configured as any type of memory. By way of example only, the memory 1904 can be implemented as random access memory, read-only memory, Flash memory, removable memory, or other types of storage elements, or combinations of such devices.

The touch sensors 1906 (which may be part of a touch and/or force sensing system) may detect various types of touch-based inputs and generate signals or data that are able to be accessed using processor instructions. The touch sensors 1906 may use any suitable components and may rely on any suitable phenomena to detect physical inputs. For example, the touch sensors 1906 may be capacitive touch sensors, resistive touch sensors, acoustic wave sensors, or the like. The touch sensors 1906 may include any suitable components for detecting touch-based inputs and generating signals or data that are able to be accessed using processor instructions, including electrodes (e.g., electrode layers), physical components (e.g., substrates, spacing layers, structural supports, compressible elements, etc.), processors, circuitry, firmware, and the like. The touch sensors 1906 may be used in conjunction with various input mechanisms to detect various types of inputs. For example, the touch sensors 1906 may be used to detect touch inputs (e.g., gestures, multi-touch inputs, taps, etc.), keyboard inputs (e.g., actuations and/or localized deformations of key regions of a glass top case), and the like. The touch sensors 1906 may be integrated with or otherwise configured to detect touch inputs on and/or deformations of a top case of a computing device (e.g., the top cases 112, 1812, or any other top case discussed herein) or on another component configured to detect touch inputs, such as the keyboard member 1811 (FIG. 18A). The touch sensors 1906 may operate in conjunction with the force sensors 1908 to generate signals or data in response to touch inputs or deformations of key regions or other areas of a glass top case.

The force sensors 1908 (which may be part of a touch and/or force sensing system) may detect various types of force-based inputs and generate signals or data that are able to be accessed using processor instructions. The force sensors 1908 may use any suitable components and may rely on any suitable phenomena to detect physical inputs. For example, the force sensors 1908 may be strain-based sensors, piezoelectric-based sensors, piezoresistive-based sensors, capacitive sensors, resistive sensors, or the like. The force sensors 1908 may include any suitable components for detecting force-based inputs and generating signals or data that are able to be accessed using processor instructions, including electrodes (e.g., electrode layers), physical components (e.g., substrates, spacing layers, structural supports, compressible elements, etc.) processors, circuitry, firmware, and the like. The force sensors 1908 may be used in conjunction with various input mechanisms to detect various types of inputs. For example, the force sensors 1908 may be used to detect clicks, presses, or other force inputs applied to a trackpad, a keyboard, key regions of a glass top case, a touch- or force-sensitive input region, or the like, any or all of which may be located on or integrated with a top case of a computing device (e.g., the top cases 112, 1812 or any other top case discussed herein) or with a keyboard member (e.g., the keyboard member 1811). The force sensors 1908 may operate in conjunction with the touch sensors 1906 to generate signals or data in response to touch- and/or force-based inputs or local deformations of a glass top case.

The device 1900 may also include one or more actuators 1912. The actuators 1912 may include one or more of a variety of haptic technologies such as, but not necessarily limited to, mechanical actuators, solenoids, hydraulic actuators, cams, piezoelectric devices, magnetic actuators, and so on. In general, the actuators 1912 may be configured to provide returning forces to key regions of a glass top case and/or to provide distinct feedback (e.g., tactile clicks) to a user of the device. For example, the actuators 1912 may be adapted to produce a knock or tap sensation and/or a vibration sensation, to produce a biasing force that biases a protrusion towards an undepressed position, or the like.

The one or more communication channels 1910 may include one or more wireless interface(s) that are adapted to provide communication between the processing unit(s) 1902 and an external device. In general, the one or more communication channels 1910 may be configured to transmit and receive data and/or signals that may be interpreted by instructions executed on the processing units 1902. In some cases, the external device is part of an external communication network that is configured to exchange data with wireless devices. Generally, the wireless interface may include, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, infrared interfaces, USB interfaces, Wi-Fi interfaces, TCP/IP interfaces, network communications interfaces, or any conventional communication interfaces.

As shown in FIG. 19, the device 1900 may include a battery 1914 that is used to store and provide power to the other components of the device 1900. The battery 1914 may be a rechargeable power supply that is configured to provide power to the device 1900 while it is being used by the user.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above and below, or their synonyms, do not necessarily refer to an absolute position relative to an external reference, but instead refer to the relative position of components with reference to the figures.

What is claimed is:

1. A keyboard for a computing device, comprising:
a bottom case; and
a glass top case coupled to a bottom case and defining:
   a top surface;
   a bottom surface opposite the top surface;
   a keyboard region along the top surface of the glass top case and defining a key region; and
   a recess defined along the bottom surface of the glass top case and extending around the key region, wherein the key region is configured to locally deform in response to an input force.

2. The keyboard of claim 1, wherein the top surface of the glass top case is substantially planar.

3. The keyboard of claim 1, wherein the glass top case further defines a protrusion along the top surface of the glass top case and opposite the recess.

4. The keyboard of claim 1, wherein the recess is defined by a reduced thickness region of the glass top case.

5. The keyboard of claim 1, further comprising a sensing system positioned below the glass top case and configured to detect the local deformation of the key region in response to the input force.

6. The keyboard of claim 5, wherein the sensing system is further configured to detect a touch input applied to the key region.

7. The keyboard of claim 6, wherein:
the keyboard further comprises a trackpad region positioned along a side of the keyboard region; and
the sensing system is further configured to detect gesture inputs applied to the trackpad region.

8. A laptop computer comprising:
a housing;
a unitary glass top case coupled to the housing and defining:
   a trackpad region;
   a keyboard region comprising a plurality of key regions; and
   a channel formed into the unitary glass top case and extending around a key region of the plurality of key regions, the channel defining a local deformation region of the unitary glass top case in the key region, the local deformation region configured to deform in response to an input force applied to the key region; and
a sensing system below the unitary glass top case and configured to detect the deformation of the local deformation region in response to the input force.

9. The laptop computer of claim 8, wherein:
the unitary glass top case has a first thickness in the key region; and
the unitary glass top case has a second thickness, less than the first thickness, in the channel.

10. The laptop computer of claim 8, wherein the channel is formed along a bottom surface of the unitary glass top case.

11. The laptop computer of claim 8, wherein:
the key region is a first key region;
the local deformation region is a first local deformation region;
the channel is a first channel; and
the unitary glass top case further comprises:
a second channel formed into the unitary glass top case and extending around a second key region of the plurality of key regions, the second channel defining a second local deformation region of the unitary glass top case in the second key region.

12. The laptop computer of claim 8, wherein the local deformation region is configured to deflect a greater distance than a region outside the local deformation region in response to the input force.

13. The laptop computer of claim 8, further comprising a display positioned below the unitary glass top case and configured to produce graphical outputs visible through the unitary glass top case.

14. The laptop computer of claim 8, wherein the sensing system comprises a piezoelectric material coupled to a bottom surface of the unitary glass top case in the key region.

15. A portable computing device comprising:
a display portion comprising a display configured to produce a graphical output; and
a base portion coupled to the display portion and comprising:
a base structure;
a transparent member coupled to the base structure and defining:
a keyboard region; and
a set of recesses formed along a surface of the transparent member and defining a plurality of key regions within the keyboard region, wherein a key region of a plurality of key regions is configured to locally deform in response to an input force; and
a sensing system positioned below the transparent member and configured to detect the local deformation of the key region.

16. The portable computing device of claim 15, wherein the transparent member is formed of glass.

17. The portable computing device of claim 15, wherein the set of recesses is formed along a bottom surface of the transparent member.

18. The portable computing device of claim 15, wherein the set of recesses defines a continuous recess extending around a periphery of the key region.

19. The portable computing device of claim 15, further comprising a light source positioned below the transparent member and configured to illuminate a glyph within the key region.

20. The portable computing device of claim 19, further comprising an opaque mask positioned on a surface of the transparent member and defining the glyph.

\* \* \* \* \*